United States Patent
Tsubaki et al.

(10) Patent No.: US 11,156,915 B2
(45) Date of Patent: Oct. 26, 2021

(54) ACTINIC RAY-SENSITIVE OR RADIATION-SENSITIVE COMPOSITION, METHOD FOR PURIFYING ACTINIC RAY-SENSITIVE OR RADIATION-SENSITIVE COMPOSITION, PATTERN FORMING METHOD, AND METHOD FOR MANUFACTURING ELECTRONIC DEVICE

(71) Applicant: FUJIFILM Corporation, Tokyo (JP)

(72) Inventors: Hideaki Tsubaki, Haibara-gun (JP); Wataru Nihashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 586 days.

(21) Appl. No.: 16/108,893

(22) Filed: Aug. 22, 2018

(65) Prior Publication Data

US 2018/0364568 A1  Dec. 20, 2018

Related U.S. Application Data

(63) Continuation of application No. PCT/JP2017/009652, filed on Mar. 10, 2017.

(30) Foreign Application Priority Data

Mar. 24, 2016 (JP) .............................. JP2016-060952

(51) Int. Cl.
G03F 7/004 (2006.01)
G03F 7/16 (2006.01)
G03F 7/20 (2006.01)
G03F 7/09 (2006.01)
G03F 7/32 (2006.01)

(52) U.S. Cl.
CPC .............. *G03F 7/0043* (2013.01); *G03F 7/09* (2013.01); *G03F 7/16* (2013.01); *G03F 7/2059* (2013.01); *G03F 7/322* (2013.01); *Y02P 70/50* (2015.11)

(58) Field of Classification Search
CPC .... G03F 7/0042; G03F 7/0043; G03F 7/0044; B01D 29/00; B01D 35/02; B01D 36/00; B01D 36/02; B01D 37/00; B01D 43/00; B01D 2239/125; B01D 2239/1241; B01D 2239/1216
See application file for complete search history.

(56) References Cited

U.S. PATENT DOCUMENTS

| 8,703,386 B2 | 4/2014 | Bass et al. |
| 2005/0227172 A1 | 10/2005 | Ozaki et al. |
| 2009/0081586 A1 | 3/2009 | Kouji et al. |
| 2011/0045406 A1 | 2/2011 | Keszler et al. |
| 2011/0293888 A1 | 12/2011 | Stowers et al. |
| 2012/0208127 A1 | 8/2012 | Hatakeyama |
| 2013/0108957 A1 | 5/2013 | Iwabuchi et al. |
| 2014/0335453 A1 | 11/2014 | Ogihara et al. |
| 2015/0056542 A1 | 2/2015 | Meyers et al. |

FOREIGN PATENT DOCUMENTS

| EP | 1 881 371 A1 | 1/2008 |
| JP | 2005-300737 A | 10/2005 |
| JP | 2010-508560 A | 3/2010 |
| JP | 2011-253185 A | 12/2011 |
| JP | 2012-185484 A | 9/2012 |
| JP | 2013-92643 A | 5/2013 |
| JP | 2014-219506 A | 11/2014 |
| JP | 2015-513540 A | 5/2015 |
| JP | 2015-197509 A | 11/2015 |
| KR | 10-2008-0014967 A | 2/2008 |
| KR | 10-2011-0137400 A | 12/2011 |
| TW | 201222144 A | 6/2012 |
| TW | 201527872 A | 7/2015 |
| TW | 201536842 A | 10/2015 |
| WO | 2015/026482 A2 | 2/2015 |
| WO | 2015/151765 A1 | 10/2015 |

OTHER PUBLICATIONS

Computer-generated translation of JP 2015-197509 (Nov. 2015). (Year: 2015).*
Communication dated Mar. 10, 2020 from the Japanese Patent Office in application No. 2018-507213.
Communication dated Mar. 19, 2020, from the Korean Intellectual Property Office in application No. KR10-2018-7022559.
Extended European Search Report dated Dec. 5, 2018 issued by the European Patent Office in counterpart application No. 17769966.7.
Communication dated Jan. 13, 2020, issued by the Korean Intellectual Property Office in Korean Application No. 10-2018-7022559.
Notice of Reasons for Refusal dated Aug. 20, 2019 issued by the Japanese Patent Office in counterpart application No. 2018-507213.
Korean Intellectual Property Office; Communication dated Jul. 6, 2020 issued in application No. 10-2018-7022559.
International Search Report dated May 16, 2017 issued by the International Searching Authority in PCT/JP2017/009652.
Written Opinion dated May 16, 2017 issued by the International Searching Authority in PCT/JP2017/009652.
International Preliminary Report on Patentability with the translation of Written Opinion dated Sep. 25, 2018 issued by the International Bureau in PCT/JP2017/009652.
Communication dated Jul. 29, 2020, from the Taiwanese Intellectual Property Office in application No. 106109478.

* cited by examiner

*Primary Examiner* — John A McPherson
(74) *Attorney, Agent, or Firm* — Sughrue Mion, PLLC

(57) ABSTRACT

An actinic ray-sensitive or radiation-sensitive composition contains a cation including a metal atom and a ligand, in which the number of particles in liquid having particle diameters of 0.15 μm or less included in 1 mL of the actinic ray-sensitive or radiation-sensitive composition is 10 or less.

12 Claims, 1 Drawing Sheet

ACTINIC RAY-SENSITIVE OR RADIATION-SENSITIVE COMPOSITION, METHOD FOR PURIFYING ACTINIC RAY-SENSITIVE OR RADIATION-SENSITIVE COMPOSITION, PATTERN FORMING METHOD, AND METHOD FOR MANUFACTURING ELECTRONIC DEVICE

CROSS-REFERENCE TO RELATED APPLICATIONS

This application is a Continuation of PCT International Application No. PCT/JP2017/9652, filed on Mar. 10, 2017, which claims priority under 35 U.S.C. § 119(a) to Japanese Patent Application No. 2016-060952, filed on Mar. 24, 2016. Each of the above application(s) is hereby expressly incorporated by reference, in its entirety, into the present application.

BACKGROUND OF THE INVENTION

1. Field of the Invention

The present invention relates to an actinic ray-sensitive or radiation-sensitive composition, a method for purifying an actinic ray-sensitive or radiation-sensitive composition, a pattern forming method, and a method for manufacturing an electronic device.

More specifically, the present invention relates to an actinic ray-sensitive or radiation-sensitive composition which can be used for a process for manufacturing a semiconductor such as an integrated circuit (IC), a process for manufacturing a circuit board for a liquid crystal, a thermal head, or the like, and other lithographic processes of photofabrication, a method for purifying an actinic ray-sensitive or radiation-sensitive composition, a pattern forming method, and a method for manufacturing an electronic device.

2. Description of the Related Art

In processes for manufacturing semiconductor devices such as an integrated circuit (IC) and a large scale integrated circuit (LSI) in the related art, microfabrication by lithography using a resist composition has been carried out.

Formation of an ultrafine pattern in a submicron region or a quarter-micron region has been demanded in accordance with realization of high integration for integrated circuits. With such a demand, exposure has been performed using g-rays in the related art, but it is now performed using i-rays, and further, as with an excimer laser light (KrF and ArF), a tendency that an exposure wavelength becomes shorter is observed. Moreover, developments in lithography using electron beams (EB), X-rays, or extreme ultraviolet rays (EUV), in addition to the excimer laser light, have also been currently proceeding.

Under such circumstances, various configurations have been proposed for a resist composition, and for example, JP2011-253185A describes a technique for forming a pattern using a resist composition including water, a metal suboxide cation, a polyatomic inorganic anion, and a ligand including a peroxide group. Further, US2015/0056542A describes a technique for forming a pattern using a resist composition including a metal cation, an organic ligand, and an organic solvent.

SUMMARY OF THE INVENTION

However, with the techniques described in JP2011-253185A and US2015/0056542A, deterioration in resolution of a pattern and generation of residual defects occur in a case where foreign matters having chemically or physically different characteristics remain even in small amounts in a resist composition, in particular, in the formation of an ultrafine pattern (for example, a pattern with a line width of 20 nm or less).

Therefore, an object of the present invention is to provide an actinic ray-sensitive or radiation-sensitive composition capable of forming a pattern having excellent resolution and few residual defects, in particular, in the formation of an ultrafine pattern (for example, a pattern with a line width of 20 nm or less), a method for purifying an actinic ray-sensitive or radiation-sensitive composition, a pattern forming method including the method for purifying an actinic ray-sensitive or radiation-sensitive composition, and a method for manufacturing an electronic device.

The present inventors have conducted studies, and as a result, they have discovered that it is possible to accomplish the objects by the following means.

<1> An actinic ray-sensitive or radiation-sensitive composition comprising:
a cation including a metal atom; and
a ligand,
in which the number of particles in liquid having particle diameters of 0.15 µm or less included in 1 mL of the actinic ray-sensitive or radiation-sensitive composition is 10 or less.

<2> The actinic ray-sensitive or radiation-sensitive composition as described in <1>,
in which the actinic ray-sensitive or radiation-sensitive composition contains a suboxide cation of a metal atom, a counter anion, a peroxide-based ligand, and water.

<3> The actinic ray-sensitive or radiation-sensitive composition as described in <1>,
in which the actinic ray-sensitive or radiation-sensitive composition contains the cation including a metal atom, an organic ligand, and an organic solvent.

<4> The actinic ray-sensitive or radiation-sensitive composition as described in any one of <1> to <3>,
in which the metal atom is at least one selected from hafnium, zirconium, and tin.

<5> The actinic ray-sensitive or radiation-sensitive composition as described in any one of <1> to <4>,
in which the metal atom is at least one selected from hafnium and zirconium.

<6> The actinic ray-sensitive or radiation-sensitive composition as described in any one of <1> to <4>,
in which the metal atom is tin.

<7> A method for purifying an actinic ray-sensitive or radiation-sensitive composition, comprising subjecting a solution of an actinic ray-sensitive or radiation-sensitive composition containing a cation including a metal atom and a ligand to circulation filtration using a filter of a polyethylene-based resin,
in which the number of particles in liquid having particle diameters of 0.15 µm or less included in 1 mL of the actinic ray-sensitive or radiation-sensitive composition after the circulation filtration is 10 or less.

<8> The method for purifying an actinic ray-sensitive or radiation-sensitive composition as described in <7>,
in which the circulation filtration is performed using a filter of a polyamide-based resin in combination with the filter of a polyethylene-based resin.

<9> The method for purifying an actinic ray-sensitive or radiation-sensitive composition as described in <7> or <8>,
in which a pore diameter of the filter of a polyethylene-based resin is 10 nm or less.

<10> A pattern forming method comprising the method for purifying an actinic ray-sensitive or radiation-sensitive composition as described in any one of <7> to <9>.

<11> A method for manufacturing an electronic device, comprising the pattern forming method as described in <10>.

According to the present invention, it is possible to provide an actinic ray-sensitive or radiation-sensitive composition capable of forming a pattern having excellent resolution and few residual defects, in particular, in the formation of an ultrafine pattern (for example, a pattern with a line width of 20 nm or less), a method for purifying an actinic ray-sensitive or radiation-sensitive composition, a pattern forming method including the method for purifying an actinic ray-sensitive or radiation-sensitive composition, and a method for manufacturing an electronic device.

DESCRIPTION OF THE PREFERRED EMBODIMENTS

Figure 1:
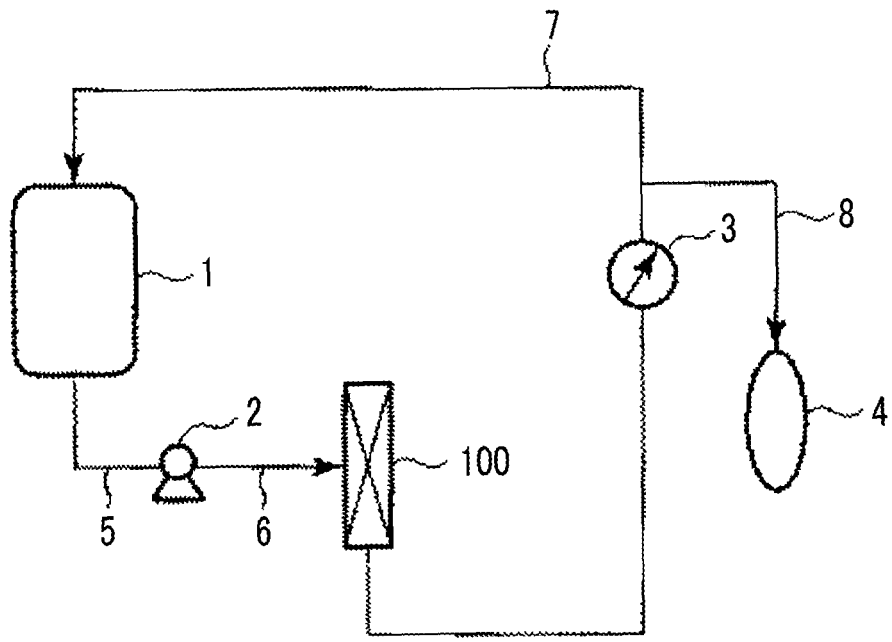
FIG. 1 is a schematic view for describing a filtration device.

Hereinafter, aspects of the present invention will be described.

Furthermore, in citations for a group (atomic group) in the present specification, in a case where the group (atomic group) is denoted without specifying whether it is substituted or unsubstituted, the group includes both a group (atomic group) having no substituent and a group (atomic group) having a substituent. For example, an "alkyl group" includes not only an alkyl group having no substituent (unsubstituted alkyl group), but also an alkyl group having a substituent (substituted alkyl group).

"Actinic rays" or "radiation" in the present specification means, for example, a bright line spectrum of a mercury lamp, far ultraviolet rays typified by an excimer laser, extreme ultraviolet rays, X-rays, electron beams, or the like. In the present invention, light means actinic rays or radiation. "Exposure" in the present specification includes, unless otherwise specified, not only exposure using a bright line spectrum of a mercury lamp, far ultraviolet rays typified by an excimer laser, X-rays, extreme ultraviolet rays, or the like, but also lithography by particle rays such as electron beams and ion beams.

In the present specification, a "(meth)acrylic monomer" means at least one of monomers having a structure of "$CH_2=CH-CO-$" or "$CH_2=C(CH_3)-CO-$". Similarly, "(meth)acrylate" and "(meth)acrylic acid" mean "at least one of acrylate or methacrylate" and "at least one of acrylic acid or methacrylic acid", respectively.

In the present specification, the numerical ranges shown with "to" are used to mean ranges including the numerical values indicated before and after "to" as lower limit values and upper limit values, respectively.

[Actinic Ray-Sensitive or Radiation-Sensitive Composition]

The actinic ray-sensitive or radiation-sensitive composition of the present invention is an actinic ray-sensitive or radiation-sensitive composition containing a cation including a metal atom and a ligand, in which the number of particles in liquid having particle diameters of 0.15 μm or less included in 1 mL of the actinic ray-sensitive or radiation-sensitive composition is 10 or less.

The actinic ray-sensitive or radiation-sensitive composition of the present invention is not particularly limited, but is preferably a resist composition.

The actinic ray-sensitive or radiation-sensitive composition in the present invention is preferably for exposure using electron beams or extreme ultraviolet rays, and more preferably for exposure using extreme ultraviolet rays.

The actinic ray-sensitive or radiation-sensitive composition of the present invention is preferably an actinic ray-sensitive or radiation-sensitive composition in any one aspect of (A) or (B).

(A) An actinic ray-sensitive or radiation-sensitive composition containing a suboxide cation (a1) of a metal atom, a counter anion (a2), a peroxide-based ligand (a3), and water (a4).

(B) An actinic ray-sensitive or radiation-sensitive composition containing a cation (b1) including a metal atom, an organic ligand (b2), and an organic solvent (b3).

The actinic ray-sensitive or radiation-sensitive composition in the aspect of (A) is also referred to as an "actinic ray-sensitive or radiation-sensitive composition (A)".

The actinic ray-sensitive or radiation-sensitive composition in the aspect of (B) is also referred to as an "actinic ray-sensitive or radiation-sensitive composition (B)".

{Actinic Ray-Sensitive or Radiation-Sensitive Composition (A)}

The actinic ray-sensitive or radiation-sensitive composition in the aspect of (A) will be described.

<Suboxide Cation (a1) of Metal Atom>

As the suboxide cation (metal suboxide cation) (a1) of a metal atom included in the actinic ray-sensitive or radiation-sensitive composition (A), for example, $VO^{2+}$, $SbO^+$, $ReO_3^+$, $TiO^{2+}$, $TaO^{3+}$, $TaO_2^+$, $YO^+$, $NbO^{2+}$, $MoO^{2+}$, $WO^{4+}$, $WO_2^{2+}$, $AlO^+$, $GaO^+$, $CrO^+$, $FeO^+$, $BiO^+$, $LaO^+$, $CeO^+$, $PrO^+$, $NdO^+$, $PmO^+$, $SmO^+$, $EuO^+$, $GdO^+$, $TbO^+$, $DyO^+$, $HoO^+$, $ErO^+$, $TmO^+$, $YbO^+$, $LuO^+$, $TiO_y(OH)_z^{(4-2y-z)+}$, $TaO_y(OH)_z^{(5-2y-z)+}$, $YO_y(OH)_z^{(3-2y-z)+}$, $NbO_y(OH)_z^{(4-2y-z)+}$, $MoO_y(OH)_z^{(4-2y-z)+}$, $WO_y(OH)_z^{(6-2y-z)+}$, $AlO_y(OH)_z^{(3-2y-z)+}$, $GaO_y(OH)_z^{(3-2y-z)+}$, $Zn(OH)^+$, $CrO_y(OH)_z^{(3-2y-z)+}$, $FeO_y(OH)_z^{(3-2y-z)+}$, $BiO_y(OH)_z^{(3-2y-z)+}$, $LaO_y(OH)_z^{(3-2y-z)+}$, $CeO_y(OH)_z^{(3-2y-z)+}$, $PrO_y(OH)_z^{(3-2y-z)+}$, $NbO_y(OH)_z^{(3-2y-z)+}$, $PmO_y(OH)_z^{(3-2y-z)+}$, $SmO_y(OH)_z^{(3-2y-z)+}$, $EuO_y(OH)_z^{(3-2y-z)+}$, $GdO_y(OH)_z^{(3-2y-z)+}$, $TbO_y(OH)_z^{(3-2y-z)+}$, $DyO_y(OH)_z^{(3-2y-z)+}$, $HoO_y(OH)_z^{(3-2y-z)+}$, $ErO_y(OH)_z^{(3-2y-z)+}$, $TmO_y(OH)_z^{(3-2y-z)+}$, $YbO_y(OH)_z^{(3-2y-z)+}$, $LuO_y(OH)_z^{(3-2y-z)+}$, $ZrO^{2+}$, $ZrOOH^+$, $Zr(OH)_2^{2+}$, $Zr(OH)_3^+$, $HfO^{2+}$, $HfOOH^+$, $Hf(OH)_2^{2+}$, $Hf(OH)_3^+$, or a combination thereof can be used. The parameters y and z can be selected such that the ions are electrostatic based on the specific oxidation states of the metal atoms.

As a preferred metal suboxide cation, a metal suboxide cation having at least one selected from hafnium and zirconium is preferable, and a metal suboxide cation including hafnium is more preferable. Examples thereof include $ZrO^{2+}$, $ZrOOH^+$, $Zr(OH)_2^{2+}$, $Zr(OH)_3^+$, $HfO^{2+}$, $HfOOH^+$, $Hf(OH)_2^{2+}$, $Hf(OH)_3^+$, a combination thereof, and/or a combination thereof with another metal suboxide cation.

Furthermore, the actinic ray-sensitive or radiation-sensitive composition (A) can further include a metal cation, for example, hafnium (Hf+), titanium ($Ti^{4+}$), zirconium ($Zr^{4+}$), cerium ($Ce^{4+}$), tin ($Sn^{4+}$), tantalum ($Ta^{5+}$), niobium ($Nb^{4+}$), yttrium ($Y^{3+}$), molybdenum ($Mo^{6+}$), tungsten ($W^{6+}$), aluminum ($Al^{3+}$), gallium ($Ga^{3+}$), zinc ($Zn^{2+}$), chromium ($Cr^{3+}$), iron ($Fe^{3+}$), bismuth ($Bi^{3+}$), scandium ($Sc^{3+}$), vanadium ($V^{4+}$), manganese ($Mn^{2+}$, $Mn^{3+}$, $Mn^{4+}$), cobalt ($Co^{2+}$, $Co^{3+}$), nickel ($Ni^{2+}$, $Ni^{3+}$), indium ($In^{3+}$), antimony ($Sb^{5+}$), iridium ($Ir^{3+}$, $Ir^{4+}$), platinum ($Pt^{2+}$, $Pt^{4+}$), lanthanum ($La^{3+}$), praseodymium ($Pr^{3+}$), neodymium ($Nd^{3+}$), promethium ($Pm^{3+}$), samarium ($Sm^{3+}$), europium ($Eu^{3+}$), gadolinium ($Gd^{3+}$), terbium ($Tb^{3+}$), dysprosium ($Dy^{3+}$), holmium ($Ho^{3+}$), erbium ($Er^{3+}$), thulium ($Tm^{3+}$), ytterbium ($Yb^{3+}$), lutetium ($Lu^{3+}$), or a combination thereof.

The content ratio of the metal suboxide cation (a1) in the actinic ray-sensitive or radiation-sensitive composition (A) is preferably from 0.01 mol/L to 1.4 mol/L, more preferably from 0.05 mol/L to 1.2 mol/L, and still more preferably from 0.1 mol/L to 1.0 mol/L.

The metal suboxide cation (a1) can be used in the form of a salt such as a halogen salt (for example, fluoride, bromide, iodide, or a combination thereof).

<Counter Anion (a2)>

The counter anion (a2) included in the actinic ray-sensitive or radiation-sensitive composition (A) may be, for example, either an inorganic anion or an organic anion. Specific examples thereof include a hydroxide ion, a halogen anion (for example, a fluoride ion, a chloride ion, a bromide ion, and an iodide ion), a substituted or unsubstituted alkylcarboxylic acid ion (for example, an acetate ion and a trifluoroacetate ion), a substituted or unsubstituted aryl carboxylate ion (for example, a benzoate ion), a substituted or unsubstituted alkylsulfonate ion (for example, a methanesulfonate ion and a trifluoromethanesulfonate ion), a substituted or unsubstituted arylsulfonate ion (for example, a para-toluenesulfonate ion and a para-dichlorobenzenesulfonate ion), an aryldisulfonate ion (for example, a 1,3-benzenedisulfonate ion, a 1,5-naphthalenedisulfonate ion, and a 2,6-naphthalenedisulfonate ion), an alkylsulfate ion (for example, a methylsulfate ion), a sulfate ion, a thiocyanate ion, a nitrate ion, a perchlorate ion, a tetrafluoroborate ion, a tetraarylborate ion, a tetrakis(pentafluorophenyl)borate ion ($B^-(C_6F_5)_4$), a hexafluorophosphate ion, a picrate ion, an amide ion (including an amide substituted with an acyl group or a sulfonyl group), and a methide ion (including a methide substituted with an acyl group or a sulfonyl group).

The counter anion is preferably a counter anion including an oxygen atom, and more preferably a sulfate ion.

The content ratio of the counter anion (a2) in the actinic ray-sensitive or radiation-sensitive composition (A) is preferably from 0.5 times to 2.0 times, more preferably from 0.75 times to 1.5 times, and still more preferably from 0.8 times to 1.3 times the content ratio of the metal suboxide cation (a1), on a molar basis.

Moreover, the actinic ray-sensitive or radiation-sensitive composition (A) may include a polyatomic anion which is oxygen-based. Through the formation of a final inorganic oxide, the oxygen-based polyatomic anion can be brought into an oxide in final solid materials. In a similar manner to a case of the cation, the properties of these anions can be dependent on a pH. Examples of the oxygen-based polyatomic anion include $SO_4^{2-}$, $BO_3^{3-}$, $AsO_4^{3-}$, $MoO_4^{2-}$, $PO_4^{3-}$, $WO_4^{2-}$, $Sea_4^{2-}$, $SiO_4^{4-}$, a protonated form thereof, and a combination thereof. The molar concentration of the polyatomic anions in the actinic ray-sensitive or radiation-sensitive composition (A) is preferably about 0.5 to about 2.0 times, more preferably about 0.75 to about 1.5 times, and still more preferably about 0.8 to about 1.3 times the molar concentration of the suboxide cation (a1) of a metal atom. The polyatomic anion may be added as an acid in a case where pH adjustment is suitable, or may also be added together with a desired metal cation. The actinic ray-sensitive or radiation-sensitive composition (A) can be prepared into a state that it includes an anion such as a halogen anion which may also be added together with the suboxide cation (a1) of a metal atom. The halogen anion can be reacted with the peroxide-based ligand (a3) to form a halogen molecule such as $Cl_2$, $Br_2$, and $I_2$. The reaction with the halogen anion reduces the peroxide concentration to an amount which is appropriate to the amount of the peroxide added.

In addition, it is also preferable that the actinic ray-sensitive or radiation-sensitive composition (A) contains a counter anion which is soluble in an organic solvent as the counter anion (a2). Examples of the counter anion which is soluble in an organic solvent include a trifluoromethanesulfonic acid and $PF_6^-$.

<Peroxide-Based Ligand (a3)>

The peroxide-based ligand (a3) included in the actinic ray-sensitive or radiation-sensitive composition (A) preferably has a peroxide group (—O—O—), and is more preferably a hydrogen peroxide. Further, an inorganic peroxide-based ligand can also be used as the peroxide-based ligand (a3). Examples of the inorganic peroxide-based ligand include a peroxysulfate ion ($SO_5H^-$), a peroxydisulfate ion ($S_2O_8^{2-}$), a peroxychlorate ion ($ClO_5H^-$), and a combination thereof.

The content ratio of the peroxide-based ligand (a3) in the actinic ray-sensitive or radiation-sensitive composition (A) is preferably from 0.5 times to 25 times, more preferably from 2 times to 25 times, still more preferably from 3 times to 25 times, particularly preferably from 4 times to 25 times, and most preferably from 5 times to 25 times the content ratio of the metal suboxide cation (a1), on a molar basis.

As the concentration of the peroxide-based ligand (a3) is higher, the stability of the actinic ray-sensitive or radiation-sensitive composition (A) is more excellent. The actinic ray-sensitive or radiation-sensitive composition (A) can be stabilized against the sedimentation of a solid matter for at least 2 hours while further stirring, and in some cases, can be stabilized for a significantly long period of time such as 1 month or more. As described above, as the peroxide-based ligand (a3), a hydrogen peroxide is preferable, but other inorganic peroxides are suitable in some cases. Further, in another aspect, organic peroxides can be used.

<Water (a4)>

As the water (a4) included in the actinic ray-sensitive or radiation-sensitive composition (A), ultrapure water is preferable.

A method for preparing the actinic ray-sensitive or radiation-sensitive composition (A) is not particularly limited, but a method in which a solution including the metal suboxide cation (a1), a solution including the counter anion (a2), and a solution including the peroxide-based ligand (a3) are individually prepared and then mixed is preferable. It is preferable that the solution including the metal suboxide cation (a1) is mixed with the solution including the peroxide-based ligand (a3) such that the peroxide-based ligand (a3) coordinates to the metal suboxide cation (a1), and the mixture is left to be stabilized for a certain period of time (for example, 5 minutes to 15 minutes), and then mixed with the solution including the counter anion (a2).

{Actinic Ray-Sensitive or Radiation-Sensitive Composition (B)}

Next, the actinic ray-sensitive or radiation-sensitive composition in the aspect of (B) will be described.

<Cation (b1) Including Metal Atom>

The cation (b1) including a metal atom included in the actinic ray-sensitive or radiation-sensitive composition (B) is preferably a cation (metal cation) of a metal atom, more preferably a cation of at least one metal selected from hafnium, zirconium, tin, antimony, and indium, still more preferably a cation of at least one metal selected from hafnium, zirconium, and tin, and particularly preferably a cation of tin. Further, as other metal cations, a cation of at least one atom selected from titanium, zirconium, hafnium, vanadium, cobalt, molybdenum, tungsten, aluminum, gallium, silicon, germanium, phosphorus, arsenic, yttrium, lanthanum, cesium, and lutetium may be included.

<Organic Ligand (b2)>

Examples of the organic ligand (b2) included in the actinic ray-sensitive or radiation-sensitive composition (B) include an alkyl group (for example, a methyl group, an ethyl group, a propyl group, a butyl group, and a t-butyl group), an aryl group (for example, a phenyl group), an aralkyl group (for example, a benzyl group), an alkenyl group (for example, a vinyl group and an allyl group), and a carboxylic ester (for example, an acetic ester, a propionic ester, a butanoic ester, and a benzoic ester).

The content ratio of the organic ligand (b2) in the actinic ray-sensitive or radiation-sensitive composition (B) is preferably from 0.25 times to 4 times, more preferably from 0.5 times to 3.5 times, still more preferably from 0.75 times to 3 times, and particularly preferably from 1 time to 2.75 times the content ratio of the cation (b1) including a metal atom, on a molar basis.

<Organic Solvent (b3)>

Examples of the organic solvent (b3) included in the actinic ray-sensitive or radiation-sensitive composition (B) include an aromatic solvent (for example, xylene and toluene), an ester-based solvent (for example, propylene glycol monomethyl ether acetate, ethyl acetate, and ethyl lactate), an alcohol-based solvent (for example, 2-methyl-2-propanol, 4-methyl-2-pentanol, 1-propanol, 1-butanol, anisole), and a ketone-based solvent (for example, methyl ethyl ketone).

The flash point of the organic solvent (b3) is preferably 10° C. or higher, more preferably 20° C. or higher, and still more preferably 25° C. or higher.

The vapor pressure of the organic solvent (b3) at 20° C. is preferably 10 kPa or less, more preferably 8 kPa or less, and still more preferably 6 kPa or less.

The content ratio of the organic solvent (b3) in the actinic ray-sensitive or radiation-sensitive composition (B) is preferably 5 to 1,000 g, and more preferably 10 to 1,000 g, with respect to 1 g of the total solid content of the actinic ray-sensitive or radiation-sensitive composition (B).

[Number of Particles in Liquid]

The number of particles in liquid having particle diameters of 0.15 μm or less included in 1 mL of the actinic ray-sensitive or radiation-sensitive composition of the present invention is 10 or less, preferably 7 or less, more preferably 5 or less, and still more preferably 3 or less.

It is considered that in a case where the number of particles in liquid having particle diameters of 0.15 μm or less included in 1 mL of the actinic ray-sensitive or radiation-sensitive composition of the present invention is 10 or less, it is possible to form a pattern having excellent resolution and few residual defects, in particular, in the formation of an ultrafine pattern (for example, a pattern with a line width of 20 nm or less).

The number of particles in liquid having particle diameters of 0.15 μm or less can be measured, for example, using a particle counted using a particle counter KS-41 manufactured by Rion Co., Ltd.

Examples of a method for setting the number of particles in liquid having particle diameters of 0.15 μm or less included in 1 mL of the actinic ray-sensitive or radiation-sensitive composition of the present invention to 10 or less include the method for purifying an actinic ray-sensitive or radiation-sensitive composition of the present invention, which will be described later.

<Basic Compound>

The actinic ray-sensitive or radiation-sensitive composition of the present invention may contain a basic compound. By incorporation of the basic compound, the stability of the actinic ray-sensitive or radiation-sensitive composition is improved.

Preferred examples of the basic compound include compounds having structures represented by Formulae (A) to (E).

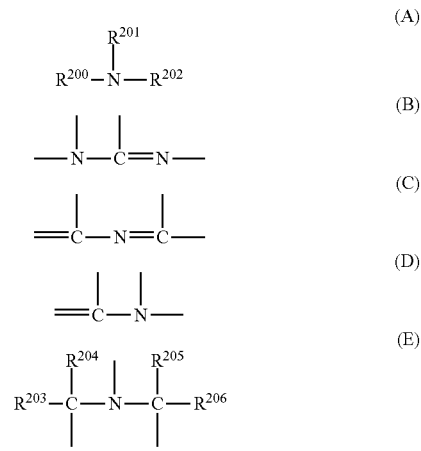

In General Formula (A), $R^{200}$, $R^{201}$, and $R^{202}$ may be the same as or different from each other, and each independently represent a hydrogen atom, an alkyl group (preferably having 1 to 20 carbon atoms), a cycloalkyl group (preferably having 3 to 20 carbon atoms), or an aryl group (preferably having 6 to 20 carbon atoms), and $R^{201}$ and $R^{202}$ may be bonded to each other to form a ring.

With regard to the alkyl group, the alkyl group having a substituent is preferably an aminoalkyl group having 1 to 20 carbon atoms, a hydroxyalkyl group having 1 to 20 carbon atoms, or a cyanoalkyl group having 1 to 20 carbon atoms.

In General Formula (E), $R^{203}$, $R^{204}$, $R^{205}$, and $R^{206}$ may be the same as or different from each other, and each independently represent an alkyl group having 1 to 20 carbon atoms.

The alkyl group in General Formulae (A) and (E) may have a substituent or may be not substituted.

It is more preferable that the alkyl groups in General Formulae (A) and (E) are unsubstituted.

Preferred examples of the compound include guanidine, aminopyrrolidine, pyrazole, pyrazoline, piperazine, aminomorpholine, aminoalkylmorpholine, and piperidine, and more preferred examples of the compound include a compound having an imidazole structure, a diazabicyclo structure, an onium hydroxide structure, an onium carboxylate structure, a trialkylamine structure, an aniline structure, or a pyridine structure, an alkylamine derivative having a hydroxyl group and/or an ether bond, and an aniline derivative having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]nona-5-ene, and 1,8-diazabicyclo[5,4,0]undeca-7-ene. Examples of the compound having an onium hydroxide structure include triarylsulfonium hydroxide, phenacylsulfonium hydroxide, sulfonium hydroxide having 2-oxoalkyl group, and specifically triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide. The compound having an onium carboxylate structure is a compound in which the anion moiety of the compound having an onium hydroxide structure becomes a carboxylate, and examples thereof include acetate, adamantane-1-carboxylate, and perfluoroalkyl carboxylate. Examples of the compound having a trialkylamine structure include tri(n-butyl) amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Preferred examples of the basic compound include an amine compound further having a phenoxy group and an ammonium salt compound having a phenoxy group.

As the amine compound, a primary, secondary, or tertiary amine compound can be used, and an amine compound having at least one alkyl group bonded to the nitrogen atom thereof is preferable. The amine compound is more preferably a tertiary amine compound. In the amine compound, as long as at least one alkyl group (preferably having 1 to 20 carbon atoms) is bonded to the nitrogen atom, a cycloalkyl group (preferably having 3 to 20 carbon atoms) or an aryl group (preferably having 6 to 12 carbon atoms) other than the alkyl group may be bonded to the nitrogen atom.

Incidentally, it is preferable that the amine compound has an oxygen atom in the alkyl chain thereof, thereby forming an oxyalkylene group. The number of oxyalkylene groups per molecule may be 1 or more, and is preferably 3 to 9, and more preferably 4 to 6. The oxyalkylene group is preferably an oxyethylene group ($—CH_2CH_2O—$) or an oxypropylene group ($—CH(CH_3)CH_2O—$ or $—CH_2CH_2CH_2O—$), and more preferably an oxyethylene group.

As the ammonium salt compound, a primary, secondary, tertiary, or quaternary ammonium salt compound can be used. An ammonium salt compound having at least one alkyl group bonded to the nitrogen atom thereof is preferable. In the ammonium salt compound, as long as at least one alkyl group (preferably having 1 to 20 carbon atoms) is bonded to the nitrogen atom, a cycloalkyl group (preferably having 3 to 20 carbon atoms) or an aryl group (preferably having 6 to 12 carbon atoms) other than the alkyl group may be bonded to the nitrogen atom.

It is preferable that the ammonium salt compound has an oxygen atom in an alkyl chain thereof, thereby forming an oxyalkylene group. The number of oxyalkylene groups per molecule may be 1 or more, and is preferably 3 to 9, and more preferably 4 to 6. The oxyalkylene group is preferably an oxyethylene group ($—CH_2CH_2O—$) or an oxypropylene group ($—CH(CH_3)CH_2O—$ or $—CH_2CH_2CH_2O—$), and more preferably an oxyethylene group.

Examples of the anion in the ammonium salt compound include a halogen atom, sulfonate, borate, and phosphate. Among those, a halogen atom and sulfonate are preferable. Among the halogen atoms, chloride, bromide, and iodide are particularly preferable. Among the sulfonates, an organic sulfonate having 1 to 20 carbon atoms is particularly preferable. Examples of the organic sulfonate include aryl sulfonate and alkyl sulfonate having 1 to 20 carbon atoms. The alkyl group in the alkyl sulfonate may have a substituent. Examples of the substituent include fluorine, chlorine, bromine, an alkoxy group, an acyl group, and an aryl group. Specific examples of the alkyl sulfonate include methane sulfonate, ethane sulfonate, butane sulfonate, hexane sulfonate, octane sulfonate, benzyl sulfonate, trifluoromethane sulfonate, pentafluoroethane sulfonate, and nonafluorobutane sulfonate. Examples of the aryl group in the aryl sulfonate include a benzene ring, a naphthalene ring, and an anthracene ring. The benzene ring, the naphthalene ring, or the anthracene ring may have a substituent. Preferred examples of the substituent include a linear or branched alkyl group having 1 to 6 carbon atoms and a cycloalkyl group having 3 to 6 carbon atoms. Specific examples of the linear or branched alkyl group and the cycloalkyl group include methyl, ethyl, n-propyl, isopropyl, n-butyl, i-butyl, t-butyl, n-hexyl, and cyclohexyl. Other examples of the substituent include an alkoxy group having 1 to 6 carbon atoms, a halogen atom, cyano, nitro, an acyl group, and an acyloxy group.

The amine compound with a phenoxy group and the ammonium salt compound with a phenoxy group are those having a phenoxy group at the end of the alkyl group of each of the amine compound and the ammonium salt compound opposite to the nitrogen atom. The phenoxy group may have a substituent. Examples of the substituent of the phenoxy group include an alkyl group, an alkoxy group, a halogen atom, a cyano group, a nitro group, a carboxyl group, a carboxylic ester group, a sulfonic ester group, an aryl group, an aralkyl group, an acyloxy group, and an aryloxy group. The position of the substituent may be any of 2- to 6-positions. The number of the substituents may be any in a range of 1 to 5.

It is preferable that at least one oxyalkylene group is contained between the phenoxy group and the nitrogen atom. The number of oxyalkylene groups per molecule may be 1 or more, and is preferably 3 to 9, and more preferably 4 to 6. The oxyalkylene group is preferably an oxyethylene group ($—CH_2CH_2O—$) or an oxypropylene group ($—CH(CH_3)CH_2O—$ or $—CH_2CH_2CH_2O—$), and more preferably an oxyethylene group.

The amine compound having a phenoxy group can be obtained by heating a primary or secondary amine having a phenoxy group with a haloalkyl ether to make a reaction, and then adding an aqueous solution of a strong base such as sodium hydroxide, potassium hydroxide, and tetraalkylammonium thereto, followed by extraction with an organic solvent such as ethyl acetate and chloroform. Alternatively, the amine compound having a phenoxy group can be obtained by heating a primary or secondary amine with a haloalkyl ether having a phenoxy group at a terminal thereof to make a reaction, and then adding an aqueous solution of a strong base such as sodium hydroxide, potassium hydroxide, and tetraalkylammonium thereto, followed by extraction with an organic solvent such as ethyl acetate and chloroform.

As the basic compound, for example, the compounds (amine compounds, amide group-containing compounds, urea compounds, nitrogen-containing heterocycle compounds, and the like) described in paragraphs 0140 to 0144 of JP2013-11833A can be used.

<Ultraviolet Absorber>

The actinic ray-sensitive or radiation-sensitive composition of the present invention may contain an ultraviolet absorber. By incorporation of the ultraviolet absorber, the stability of the actinic ray-sensitive or radiation-sensitive composition is improved. The ultraviolet absorber is preferably a conjugated diene-based compound, and more preferably a compound represented by General Formula (UV).

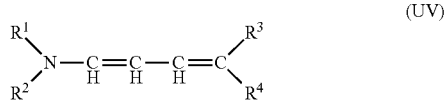

(UV)

In General Formula (UV), $R^1$ and $R^2$ each independently represent a hydrogen atom, an alkyl group having 1 to 20 carbon atoms, or an aryl group having 6 to 20 carbon atoms, and $R^1$ and $R^2$ may be the same as or different from each other, but do not represent a hydrogen atom simultaneously in any case.

$R^1$ and $R^2$ may form a cyclic amino group, together with a nitrogen atom to which $R^1$ and $R^2$ are bonded. Examples of the cyclic amino group include a piperidino group, a morpholino group, a pyrrolidino group, a hexahydroazepino group, and a piperazino group.

$R^1$ and $R^2$ are each independently preferably an alkyl group having 1 to 20 carbon atoms, more preferably an alkyl group having 1 to 10 carbon atoms, and still more preferably an alkyl group having 1 to 5 carbon atoms.

$R^3$ and $R^4$ each represent an electron-withdrawing group. Here, the electron-withdrawing group is an electron-withdrawing group having a Hammett's substituent constant, a $\sigma_p$ value (hereinafter simply referred to as a "$\sigma_p$ value") from 0.20 to 1.0, and preferably an electron-withdrawing group having a $\sigma_p$ value from 0.30 to 0.8. $R^3$ and $R^4$ may be bonded to each other to form a ring. $R^3$ and $R^4$ are each preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, or a sulfamoyl group, and more preferably an acyl group, a carbamoyl group, an alkyloxycarbonyl group, an aryloxycarbonyl group, a cyano group, an alkylsulfonyl group, an arylsulfonyl group, a sulfonyloxy group, or a sulfamoyl group.

At least one of $R^1$, $R^2$, $R^3$, or $R^4$ may be in the form of a polymer derived from a monomer bonded to a vinyl group via a linking group, or a copolymer with other monomers.

Specific examples of the ultraviolet absorber represented by General Formula (UV) include a compound represented by the following formula. With regard to the description of a substituent of the ultraviolet absorber represented by General Formula (UV), reference can be made to the descriptions in paragraph Nos. 0024 to 0033 of WO2009/123109A (<0040> to <0059> of the corresponding US2011/0039195A), the content of which is incorporated herein by reference. With regard to specific preferred examples of the compound represented by General Formula (UV), reference can be made to the descriptions of Exemplary Compounds (1) to (14) in paragraph Nos. 0034 to 0037 of WO2009/123109A (<0060> of the corresponding US2011/0039195A), the content of which is incorporated herein by reference.

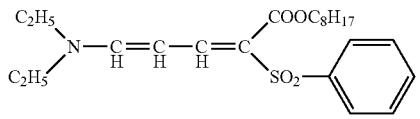

Examples of commercially available products of the ultraviolet absorber include UV503 (Daito Chemical Co., Ltd.). In addition, as the ultraviolet absorber, ultraviolet absorbers such as an aminodiene-based compound, a salicylate-based compound, a benzophenone-based compound, a benzotriazole-based compound, an acrylonitrile-based compound, and a triazine-based compound can be used. Specific examples thereof include the compounds described in JP2013-68814A. As the benzotriazole-based compound, MYUA series manufactured by MIYOSHI OIL & FAT Co., LTD. (The Chemical Daily, Feb. 1, 2016) may also be used.

<Surfactant>

The actinic ray-sensitive or radiation-sensitive composition of the present invention may include a surfactant. By incorporation of the surfactant, it is possible to form a pattern having less adhesiveness and fewer developing defects with good sensitivity and resolution in a case where an exposure light source at a wavelength of 250 nm or less, and particularly 220 nm or less is used.

As the surfactant, fluorine-based and/or silicon-based surfactants are particularly preferably used.

Examples of the fluorine-based and/or silicon-based surfactants include the surfactants described in <0276> of US2008/0248425A. Further, EFTOP EF301 or EF303 (manufactured by Shin-Akita Kasei K.K.); FLORAD FC430, 431, or 4430 (manufactured by Sumitomo 3M Inc.); MEGAFACE F171, F173, F176, F189, F113, F110, F177, F120, or R08 (manufactured by DIC Corporation); SURFLON S-382, SC101, 102, 103, 104, 105, or 106 (manufactured by Asahi Glass Co., Ltd.); TROYSOL S-366 (manufactured by Troy Chemical); GF-300 or GF-150 (manufactured by Toagosei Chemical Industry Co., Ltd.); SURFLON S-393 (manufactured by Seimi Chemical Co., Ltd.); EFTOP EF121, EF122A, EF122B, RF122C, EF125M, EF135M, EF351, EF352, EF801, EF802, or EF601 (manufactured by JEMCO Inc.); PF636, PF656, PF6320, or PF6520 (manufactured by OMNOVA); or FTX-204G, 208G, 218G, 230G, 204D, 208D, 212D, 218D, or 222D (manufactured by NEOS Co., Ltd.) may be used. In addition, a polysiloxane polymer KP-341 (manufactured by Shin-Etsu Chemical Co., Ltd.) can also be used as the silicon-based surfactant.

Furthermore, in addition to those known surfactants as shown above, the surfactant may be synthesized using a fluoro-aliphatic compound produced by a telomerization process (also called a telomer process) or an oligomerization process (also called an oligomer process). Specifically, a polymer including a fluoro-aliphatic group derived from the fluoro-aliphatic compound may be used as a surfactant as the surfactant. The fluoro-aliphatic compound can be synthesized in accordance with the method described in JP2002-90991A.

In addition, the surfactants described in <0280> of US2008/0248425A other than the fluorine-based and/or silicon-based surfactants may be used.

These surfactants may be used alone or in combination of two or more kinds thereof.

In a case where the actinic ray-sensitive or radiation-sensitive composition of the present invention includes a surfactant, the content of the surfactant is preferably more than 0% by mass and 2% by mass or less, more preferably 0.0001% to 2% by mass, and still more preferably 0.0005% to 1% by mass, with respect to the total solid content of the actinic ray-sensitive or radiation-sensitive composition.

<Other Additives>

The actinic ray-sensitive or radiation-sensitive composition of the present invention may further include, as such other additives, at least one selected from a dye, a plasticizer, a photosensitizer, a light absorber, and a compound enhancing the solubility in a developer.

[Method for Purifying Actinic Ray-Sensitive or Radiation-Sensitive Composition]

The method for purifying an actinic ray-sensitive or radiation-sensitive composition of the present invention includes subjecting a solution of an actinic ray-sensitive or radiation-sensitive composition containing a metal cation and a ligand to circulation filtration, using a filter of a polyethylene-based resin. The number of particles in liquid having particle diameters of 0.15 μm or less included in 1 mL of the actinic ray-sensitive or radiation-sensitive composition obtained by the method for purifying an actinic ray-sensitive or radiation-sensitive composition of the present invention is 10 or less.

<Filter of Polyethylene-Based Resin>

The filter of a polyethylene-based resin is a filter which has a polyethylene-based resin as a filtering material. Since the filter of a polyethylene-based resin has polyethylene-based resin fibers tightly packed as a filtering material, the size exclusion effect is significant and fine foreign matters can be effectively removed.

The polyethylene-based resin is a homopolymer or copolymer which has ethylene units in the main chain, and specific examples thereof include polyethylene and high-density polyethylene.

The filter pore diameter of the filter of a polyethylene-based resin is preferably 50 nm or less, more preferably 30 nm or less, and most preferably 10 nm or less. The lower limit value of the filter pore diameter is preferably 1 nm or more, and more preferably 2 nm or more. In a case where the pore diameter of the filter is 50 nm or less, foreign matters can be sufficiently removed, while in a case where the pore diameter is 1 nm or more, the filtration velocity is not excessively lowered.

In the present invention, a filter of a polyamide-based resin can also be used in combination with the filter of a polyethylene-based resin.

The filter of a polyamide-based resin is a filter having a polyamide-based resin as a filtering material. Since the filter of a polyamide-based resin has a polyamide-based resin with polarity as a filtering material, foreign matters with high polarity can be effectively removed.

The polyamide-based resin is a homopolymer or copolymer which has amide bonds in the main chain thereof, and specific examples thereof include Polyamide 6 and Polyamide 66.

The filter pore diameter of the filter of a polyamide-based resin is preferably 40 nm or less, more preferably 20 nm or less, and most preferably 10 nm or less. The lower limit value of the filter pore diameter of the filter of a polyamide-based resin is preferably 1 nm or more, and more preferably 2 nm or more.

In a case where the filter pore diameter of the filter of a polyamide-based resin is 40 nm or less, foreign matters can be sufficiently removed, and in a case where the filter pore diameter is 1 nm or more, the filtration velocity is not excessively slowed down.

<Filtration Device>

In a case where two or more kinds of filters are used in combination, it is preferable that the 2 two or more kinds of filters are configured to be connected in series such that a solution of the actinic ray-sensitive or radiation-sensitive composition passes through the two or more kinds of filters. Any of the filters may be configured to pass first. There is no limit in the number of filters.

Furthermore, in the purification method of the present invention, a solution of the actinic ray-sensitive or radiation-sensitive composition is subjected to filtration while circulating the solution in a filtration device, and therefore, a filter which further includes a pump (for example, a chemical pump) for supplying a solution of the actinic ray-sensitive or radiation-sensitive composition to the filter can be suitably used as the filtration device.

<Circulation Filtration>

In the purification method of the present invention, a solution of the actinic ray-sensitive or radiation-sensitive composition is subjected to filtration (which filtration may hereinafter be referred to as "circulation filtration" in some cases) while circulating the solution in a filtration device as described above to pass through a filter in plural times. The number of circulations is 1 or more, preferably 2 to 99, more preferably 4 to 49, and still more preferably 9 to 29. The circulation makes it easy to remove foreign matters. Incidentally, in a case where the number of circulations is 99 or less, the filtration time is not longer, and thus the productivity is excellent. The number of circulations is a number obtained by subtracting 1 from the number of passages of the solution of the actinic ray-sensitive or radiation-sensitive composition through the filter. That is, in a case where the solution passes through the filter twice, the number of circulations is 1. In a case where the number of passages of the actinic ray-sensitive or radiation-sensitive composition through the filter is 2 or more, there is no particular limitation, but the number is preferably 3 to 100, more preferably 5 to 50, and still more preferably 10 to 30.

For example, in a case where the circulation filtration is performed using a device as shown in FIG. 1, the number of circulations can be calculated as [(Integrated amount of the solution of the actinic ray-sensitive or radiation-sensitive composition passing through the first filter)/(Amount of the solution of the actinic ray-sensitive or radiation-sensitive composition introduced into the tank)−1].

Figure 2:
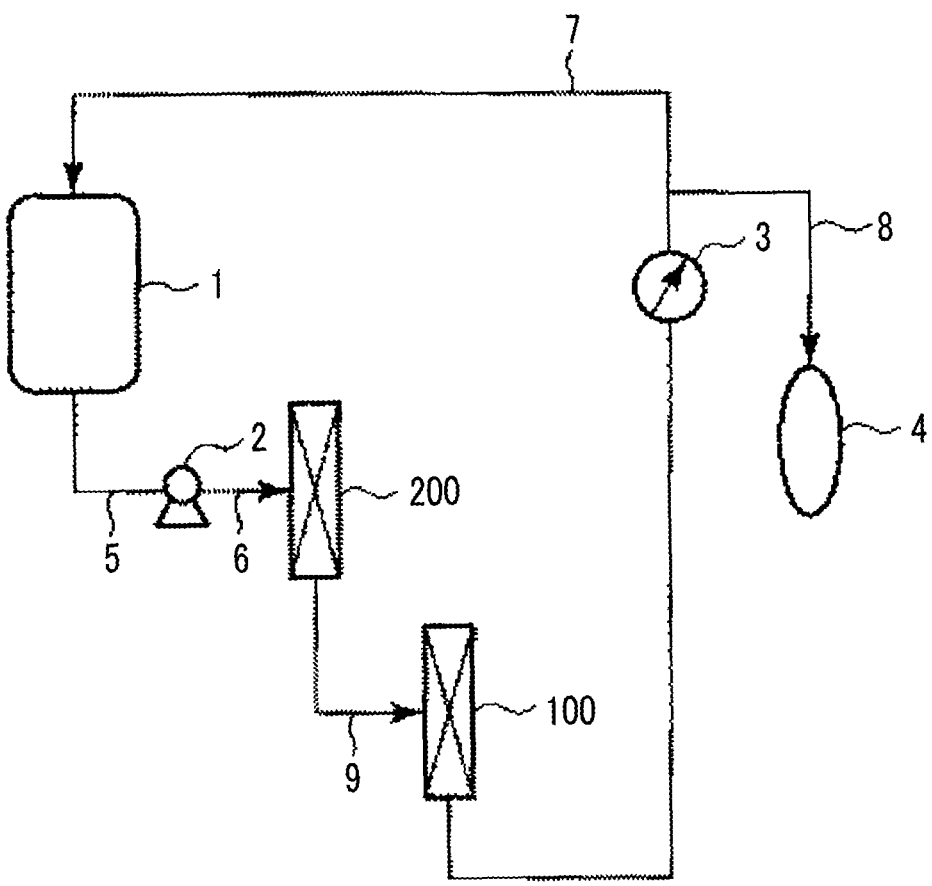
FIG. 2 is a schematic view for describing a filtration device.

In addition, in a case where the circulation filtration is performed using a device as shown in FIG. 2, the number of circulations can be calculated as [(Integrated amount of the solution of the actinic ray-sensitive or radiation-sensitive composition passing through the first filter)/(Amount of the solution of the actinic ray-sensitive or radiation-sensitive composition introduced into the tank)−1].

The time taken for the circulation filtration is preferably 1 day or less. In a case where the filtration time is 1 day or less, the solution of the actinic ray-sensitive or radiation-sensitive composition hardly causes a chemical change in an environment during the passage through the filtration material, and is thus hardly deteriorated.

Other conditions for the circulation filtration are not particularly limited. However, the velocity (filtration velocity) at which the solution of the actinic ray-sensitive or radiation-sensitive composition passes through the filter is preferably set to 20 to 110 $Lm^2$/hour, and more preferably 50 to 110 $Lm^2$/hour, in terms of a filtration line velocity. In a case where the filtration line velocity is 20 $Lm^2$/hour or more, it is less likely to cause filtration failure due to an insufficient pressure even in a case where the viscosity of the solution of the actinic ray-sensitive or radiation-sensitive composition viscosity is high. On the other hand, in a case where the filtration line velocity is 110 Lm²/hour or less, the foreign matters adsorbed and/or captured in the filter are hardly released again.

Furthermore, the temperature (filtration temperature) at which the solution of the actinic ray-sensitive or radiation-sensitive composition passes through the filter is preferably set to 15° C. to 30° C., and more preferably 17° C. to 25° C. from the viewpoint of maintain the quality of the solution of the actinic ray-sensitive or radiation-sensitive composition. In a case where the filtration temperature is 15° C. or higher, aggregates in the solution of the actinic ray-sensitive or radiation-sensitive composition are easily generated. On the other hand, in a case where the filtration temperature is 30° C. or lower, the solution of the actinic ray-sensitive or radiation-sensitive composition is hardly deteriorated.

[Pattern Forming Method]

The pattern forming method of the present invention is a pattern forming method including the method for purifying an actinic ray-sensitive or radiation-sensitive composition of the present invention.

The pattern forming method of the present invention is preferably a pattern forming method further including:

(a) a step of forming an actinic ray-sensitive or radiation-sensitive film using the actinic ray-sensitive or radiation-sensitive composition, (b) a step of exposing the actinic ray-sensitive or radiation-sensitive film with actinic rays or radiation, and (c) a step of developing the exposed actinic ray-sensitive or radiation-sensitive film with a developer, using an actinic ray-sensitive or radiation-sensitive composition purified by the method for purifying an actinic ray-sensitive or radiation-sensitive composition of the present invention.

<Step (a)>

The step (a) is a step of forming an actinic ray-sensitive or radiation-sensitive film using an actinic ray-sensitive or radiation-sensitive composition. The step (a) is preferably a step of forming an actinic ray-sensitive or radiation-sensitive film by applying an actinic ray-sensitive or radiation-sensitive composition onto a substrate.

The actinic ray-sensitive or radiation-sensitive composition is preferably a resist composition, and the actinic ray-sensitive or radiation-sensitive film is preferably a resist film.

Examples of the substrate include the same ones as substrates used in the production of a precision integrated circuit element, such as, for example, a silicon wafer, a silica substrate, a substrate including other inorganic materials, a polymer substrate with an organic polymer (for example, a polycarbonate, a polyimide, a polyester, a polyalkene, and a mixture or copolymer thereof) or the like, and a combination thereof.

Examples of the application method include suitable application methods such as spin coating, roll coating, flow coating, dip coating, spray coating, and doctor coating. Among those, the spin coating is preferable, and the rotation speed is preferably 500 to 10,000 revolutions per minute (rpm), more preferably 1,000 to 7,500 rpm, and still more preferably 2,000 to 6,000 rpm. If desired, various base films (an inorganic film, an organic film, or an antireflection film) may also be formed on the lower layer of the actinic ray-sensitive or radiation-sensitive film.

The thickness of the actinic ray-sensitive or radiation-sensitive film is preferably 1 µm or less, more preferably 250 nm or less, still more preferably 1 to 50 nm, particularly preferably 1 to 40 nm, and most preferably 1 to 25 nm.

After forming the actinic ray-sensitive or radiation-sensitive film on the substrate, the actinic ray-sensitive or radiation-sensitive film may be heated to remove the solvent included in the film and stabilize the film. The heating temperature is preferably 45° C. to 150° C., more preferably 50° C. to 130° C., and still more preferably 60° C. to 110° C. The heating time is preferably 0.1 minutes or more, more preferably 0.5 to 30 minutes, and still more preferably 0.75 to 10 minutes.

<Step (b)>

The step (b) is a step of exposing the actinic ray-sensitive or radiation-sensitive film with actinic rays or radiation, and can be performed by the following method, for example.

The actinic ray-sensitive or radiation-sensitive film formed as above is irradiated with actinic rays or radiation by passing the film through a predetermined mask. Further, the irradiation with electron beams is generally lithography (direct drawing) that is performed not through a mask.

The actinic rays or radiation is not particularly limited, but examples thereof include a KrF excimer laser, an ArF excimer laser, extreme ultraviolet rays, and electron beams, from which the extreme ultraviolet rays or the electron beams are particularly preferable, and the extreme ultraviolet rays are the most preferable.

The exposure dose for radiation is preferably 1 to 150 mJ/cm², more preferably 2 to 100 mJ/cm², and still more preferably 3 to 50 mJ/cm².

The exposure dose for electron beams is preferably from 0.1 µC/cm² to 5 mC/cm², more preferably from 0.5 µC/cm² to 1 mC/cm², and still more preferably from 1 µC/cm² to 100 µC/cm².

In a case where the actinic ray-sensitive or radiation-sensitive composition (A) containing the suboxide cation (a1) of a metal atom, the counter anion (a2), the peroxide-based ligand (a3), and water (a4) as described above is used as the actinic ray-sensitive or radiation-sensitive composition, the "—O—O—" bond in a complex formed from (a1), (a2), and (a3) is broken by the energy of actinic rays or radiation to form a "M-O-M" bond (M represents a metal atom). That is, it is considered that since the compositions in the exposed area and the unexposed area are changed and the solubility in a developer is thus changed, it is possible to form a pattern.

Furthermore, in a case where the actinic ray-sensitive or radiation-sensitive composition (B) containing the cation (b1) including a metal atom, the organic ligand (b2), and the organic solvent (b3) as described above is used as the actinic ray-sensitive or radiation-sensitive composition, the "M-C" bond or the "M-O₂C" bond in a complex formed from (b1) and (b2) is broken by the energy of actinic rays or radiation to form a "M-O" bond or a "M-O—H" bond. That is, it is considered that since the compositions in the exposed area and the unexposed area are changed and the solubility in a developer is thus changed, it is possible to form a pattern.

<Post-Exposure Baking (PEB)>

In the pattern forming method of the present invention, baking (heating) is preferably performed after the exposure and before performing the development. The heating temperature is not particularly limited as long as a good pattern is formed, and is preferably 45° C. to 150° C., more preferably 50° C. to 130° C., and still more preferably 60° C. to 110° C. The number of times of performing PEB may be one or plural. The heating time is preferably 0.1 minutes or more, more preferably 0.5 to 30 minutes, and still more preferably 0.75 to 10 minutes. The heating can be performed by a means equipped in a normal exposure or development machine, and may also be performed by using a hot plate or the like.

<Step (c)>

The step (c) is a step of developing the exposed actinic ray-sensitive or radiation-sensitive film with a developer.

<Developer>

The developer is preferably a developer containing an alkali developer or an organic solvent. The developer containing an organic solvent can also be referred to as an organic developer.

(Alkali Developer)

As the alkali developer, an aqueous alkaline solution of inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, tetraalkylammonium hydroxides such as tetramethylammonium hydroxide, tetraethylammonium hydroxide, tetrapropylammonium hydroxide, tetrabutylammonium hydroxide, tetrapentylammonium hydroxide, tetrahexylammonium hydroxide, tetraoctylammonium hydroxide, ethyltrimethylammonium hydroxide, butyltrimethylammonium hydroxide, methyltriamylammonium hydroxide, and dibutyldipentylammonium hydroxide, quaternary ammonium salts such as dimethylbis(2-hydroxyethyl)ammonium hydroxide, trimethylphenylammonium hydroxide, trimethylbenzylammonium hydroxide, and triethylbenzylammonium hydroxide, cyclic amines such as pyrrole and piperidine, or the like can be used.

Furthermore, alcohols or a surfactant can also be added in an appropriate amount to the aqueous alkaline solution.

The alkali concentration of the alkali developer is usually 0.1% to 20% by mass. The pH of the alkali developer is usually 10.0 to 15.0.

An aqueous solution including 2.38% by mass of tetramethylammonium hydroxide is particularly preferable as the alkali developer.

Generally, the developer can be an aqueous acid or base. In order to obtain a sharper image, an aqueous base can be generally used. In order to reduce contaminations caused by the developer, it may be preferable in some cases to use a developer including no metal atom. Accordingly, a composition of a quaternary ammonium hydroxide such as tetramethylammonium hydroxide, tetraethylammonium hydroxide, tetrapropylammonium hydroxide, tetrabutylammonium hydroxide, and a combination thereof is preferable as the developer. A particularly preferred quaternary ammonium hydroxide can be represented by $R_4NOH$ (in which R is a methyl group, an ethyl group, a propyl group, a butyl group, or a combination thereof). Further, a mixed quaternary tetraalkylammonium hydroxide can be selected based on empirical evaluation in order to obtain an improved line edge contour. The content ratio of tetraalkylammonium hydroxide in the developer is preferably about 2% to about 40% by mass, more preferably about 3% to about 35% by mass, and still more preferably about 4% to about 30% by mass.

The developer may include additives to facilitate the developing step, in addition to the components. Suitable examples of the additives include a dissolved salt having a cation selected from the group consisting of ammonium, a d-block metal cation (hafnium, zirconium, and the like), a f-block metal cation (lanthanum, cerium, lutetium, and the like), a p-block metal cation (aluminum, tin, and the like), an alkali metal (lithium, sodium, potassium, and the like), and a combination thereof, and a dissolved salt having an anion selected from the group consisting of fluorine, chlorine, bromine, iodine, nitric acid, sulfuric acid, phosphoric acid, silicic acid, boric acid, peroxide, butoxide, formic acid, ethylenediamine-tetraacetic acid (EDTA), tungstic acid, molybdenum acid, and the like, and a combination thereof. In a case where these optionally selected additives exist, the developer preferably includes about 10% by mass or less of the additives, and more preferably includes about 5% by mass or less of the additives. These additives can be selected so as to improve contrast, sensitivity, and line width roughness. In addition, by incorporating the additives into the developer, it is possible to suppress formation and precipitation of $HfO_2/ZrO_2$ particles.

(Organic Developer)

Next, the organic solvent included in the organic developer will be described.

The vapor pressure of the organic solvent (or an overall vapor pressure thereof in a case of a mixed solvent) at 20° C. is preferably 5 kPa or less, more preferably 3 kPa or less, and still more preferably 2 kPa or less. By setting the vapor pressure of the organic solvent to 5 kPa or less, evaporation of the developer on a substrate or in a development cup is suppressed, the temperature uniformity in the wafer plane is improved, and as a result, the dimensional uniformity in the wafer plane is improved.

Various organic solvents are widely used as the organic solvent for use in the organic developer, but for example, solvents such as an ester-based solvent, a ketone-based solvent, an alcohol-based solvent, an amide-based solvent, an ether-based solvent, and a hydrocarbon-based solvent can be used.

The ester-based solvent is a solvent having an ester bond in the molecule, the ketone-based solvent is a solvent having a ketone group in the molecule, the alcohol-based solvent is a solvent having an alcoholic hydroxyl group in the molecule, the amide-based solvent is a solvent having an amide group in the molecule, and the ether-based solvent is a solvent having an ether bond in the molecule. Among these, there is also a solvent having a plurality of the functional groups in one molecule, but in this case, such a solvent shall correspond to any solvent type including the functional group possessed by the solvent. For example, it is assumed that diethylene glycol monomethyl ether shall also fall under any of an alcohol-based solvent and an ether-based solvent in the categories. In addition, the hydrocarbon-based solvent is a hydrocarbon solvent having no substituent.

In particular, an organic developer containing at least one solvent selected from an ester-based solvent, a ketone-based solvent, an ether-based solvent, and a hydrocarbon-based solvent is preferable, an organic developer containing an ester-based solvent is more preferable, an organic developer containing butyl acetate or isoamyl acetate is still more preferable, and an organic developer containing isoamyl acetate is the most preferable.

Examples of the ester-based solvent include methyl acetate, ethyl acetate, butyl acetate, isobutyl acetate, pentyl acetate, propyl acetate, isopropyl acetate, amyl acetate (pentyl acetate), isoamyl acetate (isopentyl acetate, 3-methylbutyl acetate), 2-methylbutyl acetate, 1-methylbutyl acetate, hexyl acetate, heptyl acetate, octyl acetate, ethyl methoxyacetate, ethyl ethoxyacetate, butyl butyrate, methyl 2-hydroxyisobutyrate, propylene glycol monomethyl ether acetate (PGMEA; also referred to as 1-methoxy-2-acetoxypropane), ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, butyl propionate, pentyl propionate, hexyl propionate, heptyl propionate, butyl butanoate, isobutyl butanoate, pentyl butanoate, hexyl butanoate, isobutyl isobutanoate, propyl pentanoate, isopropyl pentanoate, butyl pentanoate, pentyl pentanoate, ethyl hexanoate, propyl hexanoate, butyl hexanoate, isobutyl hexanoate, methyl heptanoate, ethyl heptanoate, propyl heptanoate, cyclohexyl acetate, cycloheptyl acetate, 2-ethylhexyl acetate, cyclopentylpropionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these, butyl acetate, amyl acetate, isoamyl acetate, 2-methylbutyl acetate, 1-methylbutyl acetate, hexyl acetate, pentyl propionate, hexyl propionate, heptyl propionate, or butyl butanoate is preferably used, and butyl acetate or isoamyl acetate is particularly preferably used.

Examples of the ketone-based solvent include 1-octanone, 2-octanone, 1-nonanone, 2-nonanone, acetone, 2-heptanone, 4-heptanone, 1-hexanone, 2-hexanone, diisobutyl ketone, cyclohexanone, methylcyclohexanone, phenyl acetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate, and γ-butyrolactone, and among these, 2-heptanone is preferable.

Examples of the alcohol-based solvents include alcohols (monovalent alcohols) such as methanol, ethanol, 1-propanol, isopropanol, 1-butanol, 2-butanol, 3-methyl-1-butanol, tert-butyl alcohol, 1-pentanol, 2-pentanol, 1-hexanol, 1-heptanol, 1-octanol, 1-decanol, 2-hexanol, 2-heptanol, 2-octanol, 3-hexanol, 3-heptanol, 3-octanol, 4-octanol, 3-methyl-3-pentanol, cyclopentanol, 2,3-dimethyl-2-butanol, 3,3-dimethyl-2-butanol, 2-methyl-2-pentanol, 2-methyl-3-pentanol, 3-methyl-2-pentanol, 3-methyl-3-pentanol, 4-methyl-2-pentanol (methylisobutyl carbinol), 4-methyl-3-pentanol, cyclohexanol, 5-methyl-2-hexanol, 4-methyl-2-hexanol, 4,5-dimethyl-2-hexanol, 6-methyl-2-heptanol, 7-methyl-2-octanol, 8-methyl-2-nonanol, 9-methyl-2-decanol, and 3-methoxy-1-butanol, glycol-based solvents such as ethylene glycol, diethylene glycol, and triethylene glycol, and hydroxyl group-containing glycol ether-based solvents such as ethylene glycol monomethyl ether, propylene glycol monomethyl ether (PGME; also referred to as 1-methoxy-2-propanol), diethylene glycol monomethyl ether, triethylene glycol monoethyl ether, methoxymethylbutanol, ethylene glycol monoethyl ether, ethylene glycol monopropyl ether, ethylene glycol monobutyl ether, propylene glycol monoethyl ether, propylene glycol monopropyl ether, propylene glycol monobutyl ether, and propylene glycol monophenyl ether. Among these, the glycol ether-based solvent is preferably used.

Examples of the ether-based solvent include glycol ether-based solvents having no hydroxy group, such as propylene glycol dimethyl ether, propylene glycol diethyl ether, dipropylene glycol dimethyl ether, dipropylene glycol diethyl ether, diethylene glycol dimethyl ether, and diethylene glycol diethyl ether, aromatic ether solvents such as anisole and phenetole, dioxane, tetrahydrofuran, tetrahydropyran, perfluoro-2-butyltetrahydrofuran, perfluorotetrahydrofuran, and 1,4-dioxane, in addition to the glycol ether-based solvents containing a hydroxyl group. Other examples thereof include a cyclic aliphatic ether-based solvent having a branched alkyl group, such as cyclopentylisopropyl ether, cyclopentyl sec-butyl ether, cyclopentyl tert-butyl ether, cyclohexylisopropyl ether, cyclohexyl sec-butyl ether, and cyclohexyl tert-butyl ether, an acyclic aliphatic ether-based solvent having a linear alkyl group, such as di-n-propyl ether, di-n-butyl ether, di-n-pentyl ether, and di-n-hexyl ether, and an acyclic aliphatic ether-based solvent having a branched alkyl group, such as diisohexyl ether, methylisopentyl ether, ethylisopentyl ether, propylisopentyl ether, diisopentyl ether, methylisobutyl ether, ethylisobutyl ether, propylisobutyl ether, diisobutyl ether, diisopropyl ether, ethylisopropyl ether, and methylisopropyl ether. Among those, from the viewpoint of uniformity in the wafer plane, an acyclic aliphatic ether-based solvent having 8 to 12 carbon atoms is preferable, an acyclic aliphatic ether-based solvent having a branched alkyl group having 8 to 12 carbon atoms is more preferable, and diisobutyl ether, diisopentyl ether, or diisohexyl ether is particularly preferable.

As the amide-based solvent, for example, N-methyl-2-pyrrolidone, N,N-dimethylacetamide, N,N-dimethylformamide, hexamethylphosphoric triamide, and 1,3-dimethyl-2-imidazolidinone can be used.

Examples of the hydrocarbon-based solvent include aliphatic hydrocarbon-based solvents such as pentane, hexane, octane, nonane, decane, dodecane, undecane, hexadecane, 2,2,4-trimethylpentane, 2,2,3-trimethylhexane, perfluorohexane, and perfluoroheptane, aromatic hydrocarbon-based solvents such as toluene, xylene, ethylbenzene, propylbenzene, 1-methylpropylbenzene, 2-methylpropylbenzene, dimethylbenzene, diethylbenzene, ethylmethylbenzene, trimethylbenzene, ethyldimethylbenzene, and dipropylbenzene, and unsaturated hydrocarbon-based solvents such as octene, nonene, decene, undecene, dodecene, and hexadecene.

The double bond and the triple bond contained in the unsaturated hydrocarbon-based solvent may be in plural numbers, and may be present at any position of the hydrocarbon chain. Cis and trans forms of the unsaturated hydrocarbon-based solvents may be present as a mixture due to incorporation of double bonds.

Incidentally, the hydrocarbon-based solvent may be a mixture of compounds having the same number of carbon atoms and a different structure. For example, in a case where decane is used as the aliphatic hydrocarbon-based solvent, 2-methylnonane, 2,2-dimethyloctane, 4-ethyloctane, isodecane, and the like, which are compounds having the same number of carbon atoms and a different structure, may be included in the aliphatic hydrocarbon-based solvent.

Moreover, the compounds having the same number of carbon atoms and different structures may be included singly or may be included as a plurality of kinds thereof as described above.

In a case where extreme ultraviolet rays or electron beams are used in the exposing step, for the organic solvent included in the organic developer, an ester-based solvent having 7 or more carbon atoms (preferably 7 to 14 carbon atoms, more preferably 7 to 12 carbon atoms, and still more preferably 7 to 10 carbon atoms) and 2 or less heteroatoms is preferably used in a view of suppressing the swelling of the actinic ray-sensitive or radiation-sensitive film.

The heteroatom of the ester-based solvent is an atom other than a carbon atom and a hydrogen atom, and examples thereof include an oxygen atom, a nitrogen atom, and a sulfur atom. The number of heteroatoms is preferably 2 or less.

Preferred examples of the ester-based solvent having 7 or more carbon atoms and having 2 or less heteroatoms include amyl acetate, isoamyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, and isoamyl acetate is particularly preferable.

In a case where extreme ultraviolet rays or electron beams are used in the exposing step, the organic solvent included in the organic developer may be a mixed solvent of the ester-based solvent and the hydrocarbon-based solvent or a mixed solvent of the ketone-based solvent and the hydrocarbon-based solvent in place of the ester-based solvent having 7 or more carbon atoms and having 2 or less heteroatoms. Also in this case, it is effective in suppressing the swelling of the actinic ray-sensitive or radiation-sensitive film.

In a case where an ester-based solvent and a hydrocarbon-based solvent are used in combination, it is preferable to use isoamyl acetate as the ester-based solvent. From the viewpoint of adjusting the solubility of the actinic ray-sensitive or radiation-sensitive film, a saturated hydrocarbon solvent (for example, octane, nonane, decane, dodecane, undecane, and hexadecane) is preferably used as the hydrocarbon-based solvent.

In a case where a ketone-based solvent and a hydrocarbon-based solvent are used in combination, it is preferable to use 2-heptanone as the ketone-based solvent. From the viewpoint of adjusting the solubility of an actinic ray-sensitive or radiation-sensitive film, a saturated hydrocarbon solvent (for example, octane, nonane, decane, dodecane, undecane, and hexadecane) is preferably used as the hydrocarbon-based solvent.

In a case where the mixed solvent is used, the content of the hydrocarbon-based solvent depends on solvent solubility of an actinic ray-sensitive or radiation-sensitive film and is not particularly limited. Therefore, the necessary amount of the hydrocarbon-based solvent may be determined by appropriately adjusting such a mixed solvent.

The organic solvent may be used as a mixture of a plurality of solvents or may be used in admixture with a solvent other than those described above or with water. However, it is preferable that the moisture content of the whole developer is less than 10% by mass, and it is more preferable that the developer is substantially free of water. The concentration of the organic solvent (total concentration of solvents in a case of mixing a plurality of solvents) in the developer is preferably 50% by mass or more, more preferably 50% to 100% by mass, still more preferably 85% to 100% by mass, even still more preferably 90% to 100% by mass, and particularly preferably 95% to 100% by mass. Most preferred is a case consisting of substantially only an organic solvent. The case consisting of substantially only an organic solvent is intended to include a case containing a trace amount of a surfactant, an antioxidant, a stabilizer, an anti-foaming agent, or the like.

It is also preferable that the developer contains an antioxidant so that the generation of an oxidant over time can be suppressed and the content of the oxidant can be further reduced. A known antioxidant may be used as the antioxidant. In a case where the antioxidant is used for semiconductor applications, an amine-based antioxidant or a phenol-based antioxidant is preferably used.

The content of the antioxidant is not particularly limited, but it is preferably 0.0001% to 1% by mass, more preferably 0.0001% to 0.1% by mass, and still more preferably 0.0001% to 0.01% by mass, with respect to the total mass of the developer. In a case where the content of the antioxidant is 0.0001% by mass or more, a superior antioxidant effect is obtained. In a case where the content of the antioxidant is 1% by mass or less, there is tendency that generation of development residues can be suppressed.

The developer may contain a basic compound.

The developer may contain a surfactant. By incorporating the surfactant into the developer, the wettability for the actinic ray-sensitive or radiation-sensitive film is improved, and thus, the development proceeds more effectively.

In a case where the developer contains a surfactant, the content of the surfactant is preferably 0.001% to 5% by mass, more preferably 0.005% to 2% by mass, and still more preferably 0.01% to 0.5% by mass, with respect to the total mass of the developer.

As the developing method, for example, a method in which a substrate is immersed in a tank filled with a developer for a certain period of time (a dip method), a method in which development is performed by heaping a developer up onto the surface of a substrate by surface tension, and then allowing to stand it for a certain period of time (a puddle method), a method in which a developer is sprayed on the surface of a substrate (a spray method), a method in which a developer is continuously discharged onto a substrate spun at a constant rate while scanning a developer discharging nozzle at a constant rate (a dynamic dispense method), or the like can be applied.

Moreover, after the step of performing development, a step of stopping the development by replacing the solvent with another solvent may be carried out.

The development time is not particularly limited, but is usually 10 to 300 seconds, and preferably 20 to 120 seconds.

The temperature of the developer is preferably 0° C. to 50° C., and more preferably 15° C. to 35° C.

In the developing step, both of development using a developer containing an organic solvent and development using an alkali developer may be performed (so-called double development).

<Step (d)>

The pattern forming method of the present invention preferably has a step (d) of rising (washing) the developed actinic ray-sensitive or radiation-sensitive film after the step (c) using a rinsing liquid.

<Rinsing Liquid>

As the rinsing liquid in the rinsing treatment which is performed after the alkali development, pure water is used, or an appropriate amount of a surfactant can also be added thereto and the mixture can be used.

In addition, after the developing treatment or the rinsing treatment, a treatment for removing the developer or rinsing liquid adhering on the pattern by a supercritical fluid can be performed.

As the rinsing liquid in the rinsing treatment which is performed after the organic solvent development, a rinsing liquid containing an organic solvent (organic rinsing liquid) is preferably used.

The vapor pressure of the rinsing liquid (overall vapor pressure of solvents in a case of being a mixed solvent) at 20° C. is preferably from 0.05 kPa to 5 kPa, more preferably from 0.1 kPa to 5 kPa, and still more preferably from 0.12 kPa to 3 kPa. By setting the vapor pressure of the rinsing liquid to from 0.05 kPa to 5 kPa, the temperature uniformity in the wafer plane is improved, the swelling due to permeation of the rinsing liquid is further suppressed, and the dimensional uniformity in the wafer plane is improved.

(Organic Solvent)

Various organic solvents are used as the organic solvent included in the organic rinsing liquid, but it is preferable to use at least one organic solvent selected from the group consisting of a hydrocarbon-based solvent, a ketone-based solvent, an ester-based solvent, an alcohol-based solvent, an amide-based solvent, and an ether-based solvent. It is particularly preferable that the rinsing liquid includes a hydrocarbon-based solvent. Specific examples of these organic solvents are the same as those of the organic solvents described for the developer.

With regard to the organic solvent included in the organic rinsing liquid, in a case where extreme ultraviolet rays or electron beams are used in the exposure step, it is preferable to use a hydrocarbon-based solvent among the organic solvents, and it is more preferable to use an aliphatic hydrocarbon-based solvent. From the viewpoint that the effect is more improved, the aliphatic hydrocarbon-based solvent used in the rinsing liquid is preferably an aliphatic hydrocarbon-based solvent having 5 or more carbon atoms (for example, pentane, hexane, octane, decane, undecane, dodecane, and hexadecane), more preferably an aliphatic hydrocarbon-based solvent having 8 or more carbon atoms, and still more preferably an aliphatic hydrocarbon-based solvent having 10 or more carbon atoms.

Furthermore, the upper limit of the number of carbon atoms in the aliphatic hydrocarbon-based solvent is not particularly limited, but it may be, for example, 16 or less, preferably 14 or less, and more preferably 12 or less.

Among the aliphatic hydrocarbon-based solvents, decane, undecane, or dodecane is particularly preferable, and undecane is most preferable.

By using a hydrocarbon-based solvent (particularly an aliphatic hydrocarbon-based solvent) as the organic solvent included in the rinsing liquid as above, the developer which has been slightly impregnated into the actinic ray-sensitive or radiation-sensitive film after the development is washed away to further exert the effects of further suppressing the swelling and suppressing the pattern collapse.

Furthermore, examples of the hydrocarbon-based solvent also include unsaturated hydrocarbon-based solvents such as octene, nonene, decene, undecene, dodecene, and hexadecene.

The double bond and the triple bond contained in the unsaturated hydrocarbon solvent may be plural, and may be present at any position of the hydrocarbon chain. Cis and trans forms of the unsaturated hydrocarbon solvents may be present as a mixture due to incorporation of double bonds.

Moreover, the hydrocarbon-based solvent may be a mixture of compounds having the same number of carbon atoms and a different structure. For example, in a case where decane is used as the aliphatic hydrocarbon-based solvent, 2-methylnonane, 2,2-dimethyloctane, 4-ethyloctane, isodecane, and the like, which are compounds having the same number of carbon atoms and a different structure, may be included in the aliphatic hydrocarbon-based solvent.

Incidentally, the compounds having the same number of carbon atoms and different structures may be included singly or may be included as a plurality of kinds thereof as described above.

A plurality of organic solvents may be mixed, or may be mixed with an organic solvent other than those described above. The solvent may be mixed with water, but the moisture content in the rinsing liquid is usually 60% by mass or less, preferably 30% by mass or less, still more preferably 10% by mass or less, and most preferably 5% by mass or less. By setting the moisture content to 60% by mass or less, good rinsing characteristics can be obtained.

The rinsing liquid preferably contains a surfactant. With the surfactant, the wettability to the actinic ray-sensitive or radiation-sensitive film is improved, and the washing effects tend to be further improved.

The content of the surfactant is usually 0.001% to 5% by mass, preferably 0.005% to 2% by mass, and still more preferably 0.01% to 0.5% by mass, with respect to the total mass of the rinsing liquid.

The rinsing liquid preferably contains an antioxidant. With the antioxidant, generation of an oxidant over time can be suppressed, and the content of the oxidant can be further reduced. Specific examples and the content of the antioxidant are as described in the section of Developer.

In the rinsing step, the wafer subjected to development is subjected to washing using the rinsing liquid. A method for the washing treatment is not particularly limited, and examples thereof include a method of continuously ejecting a rinsing liquid on a substrate spinning at a given speed (spin coating method), a method of immersing a substrate in a bath filled with a rinsing liquid for a given period of time (dip method), or a method of spraying a rinsing liquid on a substrate surface (spray method). Among them, it is preferable that the washing treatment is carried out by the spin coating method and then the substrate is spun at a rotation speed of 2,000 rpm to 4,000 rpm to remove the rinsing liquid from the substrate.

<Housing Container>

In a case where the developer is an organic solvent, as an organic solvent that can be used in the developer and the rinsing liquid, it is preferable to use one stored in a housing container for housing an organic treatment liquid, in which the container has a housing portion. The housing container is preferably, for example, a housing container for housing an organic treatment liquid, in which the inner wall of the housing portion being in contact with the organic treatment liquid is formed of a resin different from a polyethylene resin, a polypropylene resin, and a polyethylene-polypropylene resin, or of a metal that has been subjected to rust-preventing and metal elution-preventing treatments. An organic solvent to be used as an organic treatment liquid is contained in the housing portion of the housing container, and the organic solvent discharged from the housing portion can be used in the pattern forming method of the present invention.

In a case where the housing container further has a sealing part for sealing the housing portion, the sealing part is also preferably formed of a resin different from a polyethylene resin, a polypropylene resin, and a polyethylene-polypropylene resin, or of a metal that has been subjected to rust-preventing and metal elution-preventing treatments.

Here, the sealing part means a member capable of shielding the housing portion from the outside air, and suitable examples thereof include a packing and an O ring.

The resin different from a polyethylene resin, a polypropylene resin, and a polyethylene-polypropylene resin is preferably a perfluoro resin.

Examples of the perfluoro resin include a tetrafluoroethylene resin (PTFE), a tetrafluoroethylene-perfluoroalkyl vinyl ether copolymer resin (PFA), a tetrafluoroethylene-hexafluoropropylene copolymer resin (FEP), a tetrafluoroethylene-ethylene copolymer resin (ETFE), a trifluoroethylene chloride-ethylene copolymer resin (ECTFE), a polyvinylidene fluoride resin (PVDF), a trifluoroethylene chloride copolymer resin (PCTFE), and a polyvinyl fluoride resin (PVF).

Particularly preferred examples of the perfluoro resin include a tetrafluoroethylene resin, a tetrafluoroethylene-perfluoroalkyl vinyl ether copolymer resin, and a tetrafluoroethylene-hexafluoropropylene copolymer resin.

Examples of the metal which is subjected to the rust-preventing and metal elution-preventing treatments include carbon steel, alloy steel, nickel chrome steel, nickel chrome molybdenum steel, chrome steel, chrome molybdenum steel, and manganese steel.

As the rust-preventing and metal elution-preventing treatment, a coating technique is preferably applied.

The coating technique is largely divided into three kinds of coatings such as metal coating (various platings), inorganic coating (various chemical conversion treatments, glass, concrete, ceramics, and the like) and organic coating (a rust-preventing oil, a paint, rubber, and plastics).

Preferred examples of the coating technique include a surface treatment using a rust-preventing oil, a rust inhibitor, a corrosion inhibitor, a chelate compound, a peelable plastic, or a lining agent.

Among those, a surface treatment with various corrosion inhibitors such as chromate, nitrite, silicate, phosphate, carboxylic acids such as oleic acid, dimer acid, and naphthalenic acid, a carboxylic acid metallic soap, sulfonate, an amine salt, esters (a glycerin ester or a phosphate ester of a higher fatty acid), and chelate compounds such as ethylenediaminetetraacetic acid, gluconic acid, nitrilotriacetic acid, hydroxyethylethylenediaminetriacetic acid, and diethylenetriaminepentaacetic acid, and a lining with a fluorine resin are preferable. The surface treatment with a phosphate-treated corrosion inhibitor and the lining with a fluorine resin are particularly preferable.

Furthermore, a "pre-treatment" which is at a pre-stage for the rust-preventing treatment is also preferably employed as a treatment method which leads to extension of an anti-rust period through a coating treatment although not directly preventing rust, as compared with a direct coating treatment.

Specific suitable examples of such a pre-treatment include a treatment for removing various corrosive factors, such as chloride and sulfate, which are present on a metal surface, through washing or polishing.

Specific examples of the housing container include the following ones.

FluoroPurePFA complex drum manufactured by Entegris Inc. (liquid contact inner surface: PFA resin lining)

Steel-made drum can be manufactured by JFE (liquid contact inner surface: zinc phosphate film)

Moreover, examples of the housing container which can be used in the present invention include the containers described in <0013> to <0030> of JP1999-021393A (JP-H11-021393A), and <0012> to <0024> of JP1998-45961A (JP-H10-45961A).

An electrically conductive compound may be added to the organic treatment liquid in the present invention in order to prevent the failure of chemical liquid pipes or various parts (a filter, an O-ring, a tube, and the like) associated with electrostatic charge and subsequently occurring electrostatic discharge. The electrically conductive compound is not particularly limited, but examples thereof include methanol. The addition amount thereof is not particularly limited, but is preferably 10% by mass or less, and more preferably 5% by mass or less, from the viewpoint of maintaining preferred development characteristics. For the members of the chemical liquid pipes, various pipes coated with stainless steel (SUS), or with polyethylene, polypropylene, or fluorine resins (polytetrafluoroethylene, a perfluoroalkoxy resin, and the like) which has been subjected to an antistatic treatment can be used. Similarly, with respect to the filters and the O-rings, polyethylene, polypropylene, or fluorine resins (polytetrafluoroethylene, a perfluoroalkoxy resin, and the like) which has been subjected to an antistatic treatment can be used.

Generally, the pattern obtained by the pattern forming method of the present invention is suitably used as an etching mask of a semiconductor device or the like, but it can also be used for other applications. Other applications include, for example, formation of a guide pattern in Directed Self-Assembly (DSA) (see, for example, ACS Nano Vol. 4 No. 8 Pages 4815-4823), and use as a core material (core) of a so-called spacer process (see, for example, JP1991-270227A (JP-H03-270227A) and JP2013-164509A).

[Method for Manufacturing Electronic Device]

The present invention also relates to a method for manufacturing an electronic device, including the pattern forming method of the present invention as described above.

An electronic device manufactured by the method for manufacturing an electronic device of the present invention is suitably mounted on electric electronic equipment (such as home electronics, office automation (OA) equipment, media-related equipment, optical equipment, telecommunication equipment, and the like).

EXAMPLES

Hereinbelow, the present invention will be described in more detail with reference to Examples, but the present invention is not limited thereto.

Example 1

(Preparation of Actinic Ray-Sensitive or Radiation-Sensitive Composition Containing Metal Suboxide Cation, Counter Anion, Peroxide-Based Ligand, and Water)

Each of different aqueous solutions for a metal suboxide cation, a counter anion, and a peroxide-based ligand was prepared. The aqueous solution including the metal suboxide cation is referred to as a solution (A), the aqueous solution including the peroxide-based ligand is referred to as a solution (B), and the aqueous solution including the counter anion is referred to as a solution (C).

500 mL of ultrapure water (electrical resistivity of 18 M$\Omega$·cm) and 0.5 molar $ZrOCl_2 \cdot 8H_2O$ (99.9% by mass of Alfa Aesar) were mixed to prepare a solution (A). $H_2O_2$ (aqueous) (30% by mass, Mallinckrodt Baker) was diluted with ultrapure water to produce a 6%- to 8%-by-mass $H_2O_2$ (aqueous) solution, thereby preparing a solution (B).

A solution (C) including 2 to 5 mol/L $H_2SO_4$ (aqueous) was obtained at a guaranteed concentration (Fischer Scientific, 5 mol/L) or a concentration solution (98% by mass $H_2SO_4$, Mallinckrodt Baker) thereof was diluted with ultrapure water.

The solution (A), the solution (B), and the solution (C) were respectively weighed and put into individual pre-cleaned polyethylene bottles. Ultrapure water in an amount sufficient to obtain a targeted final metal concentration was added to the solution (C). 4.8 mL of the solution (A) (Zr) was poured into 1.8 mL of the solution (B) ($H_2O_2$) to mix the components in the bottles and left to stand for 5 minutes, and then 2.16 mL of the solution (C) ($H_2SO_4$ (aqueous)) and 21.24 mL of ultrapure water were poured into the mixture of the solution (A) and the solution (B) and further left to stand for 5 minutes.

According to the method, 30 mL of a blend of the solutions having a zirconium concentration of 0.16 mol/L was obtained.

The obtained solution was filtered by the method shown in Table 1 which will be described later to obtain an actinic ray-sensitive or radiation-sensitive composition (resist composition).

As the filter used in Examples, filters described below were used, but a filter that is usable in the production method of the present invention is not limited thereto.

For a polyethylene-made filter, "PE-Clean, High-Density Polyethylene (HDPE)" manufactured by Nihon Pall Ltd. was used. As the pore diameter, a pore diameter described in Table 1 was used. The pore diameter is specifically 2 nm, 5 nm, 10 nm, 30 nm, or 50 nm, and the filtered surface area is each 1.3 m$^2$, 1.3 m$^2$, 1.3 m$^2$, 1.1 m$^2$, or 1.4 m$^2$.

As the Nylon 6,6-made filter, "PhotoClean DDF, Ultipleat•P-nylon, filtered surface area of 2,500 cm$^2$" manufactured by Nihon Pall Ltd. was used. The pore diameters described in Table 1 were used.

(Pattern Formation)

An 8-inch silicon wafer was used as a substrate. The surface of the silicon wafer was pre-treated with a basic surfactant, an acidic surfactant, $O_2$ plasma, UV ozone, a piranha etching solution, or dimethyl sulfoxide (DMSO). Subsequently, the silicon wafer was heated to 225° C., and thus, a surface thereof was hydrophilized. The wafer was loaded onto a spin coater, and the actinic ray-sensitive or radiation-sensitive composition was quantitatively discharged in the center of the wafer. The amount of the actinic ray-sensitive or radiation-sensitive composition quantitatively discharged was selected based on a desired coating thickness and a desired size of the wafer. The spin coater was rotated at 100 rotations per minute (rpm) for 5 seconds, and the actinic ray-sensitive or radiation-sensitive composition was sprayed on the entire wafer, and then rotated at 3,000 rpm for 30 seconds to form an actinic ray-sensitive or radiation-sensitive film (resist film). The wafer having the actinic ray-sensitive or radiation-sensitive film formed thereon was pre-exposure baked at 100° C. for 0.1 minutes, thereby forming an actinic ray-sensitive or radiation-sensitive film having a thickness of 50 nm.

The actinic ray-sensitive or radiation-sensitive film was irradiated with light rays at a wavelength of 13.5 nm through a pattern mask, using a lithographic processing system having an EUV laser source (MET manufactured by Exitech Ltd., NA 0.3). After irradiation, the actinic ray-sensitive or radiation-sensitive film was post-exposure baked on a hot plate at 100° C. for 1 minute. Using a puddle development method, the actinic ray-sensitive or radiation-sensitive film was developed with a 2.38%-by-mass aqueous tetramethylammonium hydroxide (TMAH) solution. Specifically, the developer was brought into contact with the actinic ray-sensitive or radiation-sensitive film for 20 seconds, and then the pattern after development was rinsed with water and dried.

One inch is 25.4 mm.

As a pattern mask to be used, a mask in which a light-shielding band that suppresses unnecessary reflection of EUV was disposed in the outer circumference of the pattern may be used, or a mask in which fine irregularities were provided in the bottom of a dug in the light-shielding band may be used. By using such a mask, it is possible to form a circuit pattern by suppressing the "out-of-band light".

Examples 2 to 4

A pattern was obtained by the same method as in Example 1 except that the filtration method was changed to a method described in Table 1.

Example 5

(Preparation of Actinic Ray-Sensitive or Radiation-Sensitive Composition Containing Metal Suboxide Cation, Counter Anion, Peroxide-Based Ligand, and Water)

Each of different aqueous solutions for a metal suboxide cation, a counter anion, and a peroxide-based ligand was prepared. The aqueous solution including the metal suboxide cation is referred to as a solution (A2), the aqueous solution including the peroxide-based ligand is referred to as a solution (B2), and the aqueous solution including the counter anion is referred to as a solution (C2).

A 0.5 molar $HfOCl_2 \cdot 8H_2O$ (204.76 g, 98% by mass of Alfa Aesar) solution which had been mixed with 500 mL of ultrapure water was filtered to prepare a solution (A2).

$H_2O_2$ (aqueous) (30% by mass, ultrapure water to produce a 6%- to 8%-by-mass Mallinckrodt Baker) was diluted with a (aqueous) $H_2O_2$ solution to prepare a solution (B2).

A solution (C2) including 2 to 5 mol/L $H_2SO_4$ (aqueous) was obtained at a guaranteed concentration (Fischer Scientific, 5 mol/L) or a concentration solution (98% by mass $H_2SO_4$, Mallinckrodt Baker) thereof was diluted with ultrapure water.

The solution (A2), the solution (B2), and the solution (C2) were respectively weighed and put into individual pre-cleaned polyethylene bottles. Ultrapure water in an amount sufficient to obtain a targeted final metal concentration was added to the solution (C2). Then, 4.5 mL of the solution (A2) (Hf) was poured into 16.875 mL of the solution (B2) ($H_2O_2$) to mix the components in the bottles and left to stand for 5 minutes, and then 1.8 mL of the solution (C2) ($H_2SO_4$ (aqueous)) and 6.825 mL of ultrapure water were poured into the mixture of the solution (A2) and the solution (B2) and further left to stand for 5 minutes.

According to the method, 30 mL of a blend of the solutions having a hafnium concentration of 0.15 mol/L was obtained.

The obtained solution was filtered by the method shown in Table 1 which will be described later to obtain an actinic ray-sensitive or radiation-sensitive composition (resist composition).

(Pattern Formation)

A pattern was formed by performing the same procedure as in Example 1 using the actinic ray-sensitive or radiation-sensitive composition obtained above.

Examples 6 to 8

A pattern was obtained by the same method as in Example 5 except that the filtration method was changed to a method described in Table 1.

Example 9

(Preparation of Actinic Ray-Sensitive or Radiation-Sensitive Composition Containing Cation Including Metal Atom, Organic Ligand, and Organic Solvent)

Powder (TCI America) of 0.209 g of monobutyltin oxide (BuSnOOH) was added to 10 mL of 4-methyl-2-pentanol. This solution was placed in an airtight container and stirred for 24 hours. Thereafter, the solution was centrifuged for 15 minutes at 4,000 rpm, and the insolubles were filtered through a polytetrafluoroethylene (PTFE)-made syringe filter having a pore diameter of 0.45 µm to obtain an actinic ray-sensitive or radiation-sensitive composition (resist composition).

(Pattern Formation)

A 25 mm×25 mm silicon wafer was used as a substrate. The surface of the silicon wafer was pretreated with ultraviolet ozone for a 10-minute cycle. A selected actinic ray-sensitive or radiation-sensitive composition was spin-coated on the wafer for 30 seconds at 4,500 rpm to form an actinic ray-sensitive or radiation-sensitive film (resist film). The wafer having the actinic ray-sensitive or radiation-sensitive film formed thereon was pre-exposure baked at 100° C. for 2 minutes, thereby forming an actinic ray-sensitive or radiation-sensitive film having a thickness of 22 nm.

The actinic ray-sensitive or radiation-sensitive film was irradiated with 101 mJ/cm$^2$ of light rays at a wavelength of 13.5 nm through a pattern mask, using a lithographic processing system having an EUV laser source (MET manufactured by Exitech Ltd., NA 0.3). After irradiation, the actinic ray-sensitive or radiation-sensitive film was post-exposure baked (PEB) at 165° C. for 2 minutes. Using a puddle development method, the actinic ray-sensitive or radiation-sensitive film after PEB was developed with propylene glycol monomethyl ether acetate (PGMEA), rinsed with deionized water, and finally heated at 200° C. for 5 minutes.

Examples 10 to 12

A pattern was obtained by the same method as in Example 9 except that the filtration method was changed to a method described in Table 1.

Example 13

A pattern was obtained by the same method as in Example 9 except that the solution of monobutyltin oxide (BuSnOOH) in 4-methyl-2-pentanol was changed to a solution (0.025 mol/L) of dibutyltin diacetate in n-propanol.

Examples 14 to 16

A pattern was obtained by the same method as in Example 13 except that the filtration method was changed to a method described in Table 1.

Example 17

A pattern was obtained by the same method as in Example 9 except that the developer was changed to butyl acetate and the rinsing step was removed.

Example 18

A pattern was obtained by the same method as in Example 9 except that the developer was changed to isoamyl acetate and the rinsing step was removed.

Example 19

A pattern was obtained by the same method as in Example 9 except that the developer was changed to 2-heptanone and the rinsing step was removed.

Example 20

A pattern was obtained by the same method as in Example 9 except that the developer was changed to butyl acetate and the rinsing liquid was changed to 4-methyl-2-pentanol.

Example 21

A pattern was obtained by the same method as in Example 9 except that the developer was changed to butyl acetate and the rinsing liquid was changed to decane.

Example 22

A pattern was obtained by the same method as in Example 9 except that the developer was changed to isoamyl acetate and the rinsing liquid was changed to undecane.

Example 23

A pattern was obtained by the same method as in Example 9 except that the developer was changed to isoamyl acetate and the rinsing liquid was changed to 4-methyl-2-pentanol.

Example 24

A pattern was obtained by the same method as in Example 9 except that the developer was changed to isoamyl acetate and the rinsing liquid was changed to di-n-butyl ether.

Example 25

A pattern was obtained by the same method as in Example 9 except that the developer was changed to isoamyl acetate and the rinsing liquid was changed to decane.

Example 26

A pattern was obtained by the same method as in Example 5 except that the developer was changed to a 2.38%-by-mass aqueous tetramethylammonium hydroxide (TMAH) solution including 1.0% by mass of KOH as an additive.

Comparative Example 1

A pattern was obtained by the same method as in Example 1 except that the filtration method was changed to the method described in Table 1 which will be described later.

Comparative Example 2

A pattern was obtained by the same method as in Example 9 except that the filtration method was changed to the method described in Table 1 which will be described later.

Comparative Example 3

A pattern was obtained by the same method as in Example 9 except that the filtration method was changed to the method described in Table 1 which will be described later.

<Circulation Filtration Method>

[Filtration Device 1]

As shown in FIG. 1, a tank 1, a pump 2, and a column 100 with a first filter installed were connected to flow paths 5, 6, and 7. In the flow path 7, a flow meter 3 and a filling port 8 were installed, and in a container 4 filled with a treatment liquid, a device capable of filling an actinic ray-sensitive or radiation-sensitive composition after treatment was assembled. The pump 2 was driven such that a solution of the actinic ray-sensitive or radiation-sensitive composition contained in the tank 1 was circulated in a closed system in the order of the tank 1, the pump 2, and the column 100.

Here, the number of circulations was defined as follows: [(Integrated amount of the solution of the actinic ray-sensitive or radiation-sensitive composition passing through the first filter)/(Amount of the solution of the actinic ray-sensitive or radiation-sensitive composition introduced into the tank)−1].

In Examples 1 to 5, 9 to 13, and 17 to 26, and Comparative Examples 1 to 3, the filtration device 1 was used.

[Filtration Device 2]

As shown in FIG. 2, a tank 1, a pump 2, a column 100 with a first filter installed, and a column 200 with a second filter installed were connected to flow paths 5, 6, 7, and 9. In the flow path 7, a flow meter 3 and a filling port 8 were installed, and in a container 4 filled with a treatment liquid, a device capable of filling an actinic ray-sensitive or radiation-sensitive composition after treatment was assembled. The pump 2 was driven such that a solution of the actinic ray-sensitive or radiation-sensitive composition contained in the tank 1 was circulated in a closed system in the order of the tank 1, the pump 2, the column 200, and the column 100.

Here, the number of circulations was defined as follows: [(Integrated amount of the solution of the actinic ray-sensitive or radiation-sensitive composition passing through the first filter)/(Amount of the solution of the actinic ray-sensitive or radiation-sensitive composition introduced into the tank)−1].

In Examples 6 to 8, and 14 to 16, the filtration device 2 was used.

<Resolving Power>

The resolution situations of 1:1 line-and-space patterns having line widths of 20 nm, 18 nm, 16 nm, 15 nm, 14 nm, and 13 nm were observed using a scanning electron microscope (S-938011 manufactured by Hitachi Ltd.). A case where the pattern is resolved without problems is denoted as A, and the other cases are denoted as B or C on the basis of the following standard. Resolution of the pattern having a smaller size indicates better resolution performance.

A: Resolved

B: Partially not resolved (it is possible to measure the line width)

C: Not resolved (it is difficult to measure the line width)

<Residual Defects>

The pattern shapes of 1:1 line-and-space patterns with a line width of 20 nm obtained by the method were observed by a scanning electron microscope (S-938011 manufactured by Hitachi Ltd.), and the number of residual defects was determined. While shifting the observation points by 1 μm, 1,000 sheets of photography were taken and the number of residual defects found on the pattern was counted. A smaller number of residual defects indicates better performance.

<Method for Measuring Particles in Liquid>

For the obtained actinic ray-sensitive or radiation-sensitive composition, the number (particles/mL) of particles having particle diameters of 0.15 μm or less in the actinic ray-sensitive or radiation-sensitive composition immediately after the preparation thereof was measured. For the measurement of the number of particles, the number was counted using a particle counter KS-41 manufactured by Rion Co., Ltd.

The filtration method and the evaluation results of Examples and Comparative Examples are shown in Table 1 below.

TABLE 1

| | Filtration method | | | Evaluation results | | | | | | | |
|---|---|---|---|---|---|---|---|---|---|---|---|
| | Number of circulations (times) | Materials of first filter (pore diameter) | Materials of second filter (pore diameter) | Number (particles/mL) of particles in liquid | 20 nm Resolution | 18 nm Resolution | 16 nm Resolution | 15 nm Resolution | 14 nm Resolution | 13 nm Resolution | Number (defects) of residual defects |
| Example 1 | 2 | Polyethylene (50 nm) | None | 10 | A | A | A | B | B | C | 50 |
| Example 2 | 4 | Polyethylene (30 nm) | None | 8 | A | A | A | B | B | C | 23 |
| Example 3 | 9 | Polyethylene (10 nm) | None | 6 | A | A | A | A | B | B | 12 |
| Example 4 | 29 | Polyethylene (5 nm) | None | 2 | A | A | A | A | A | A | 6 |
| Example 5 | 2 | Polyethylene (2 nm) | None | 1 | A | A | A | A | A | A | 3 |
| Example 6 | 4 | Polyethylene (10 nm) | Nylon 6.6 (20 nm) | 4 | A | A | A | A | A | A | 9 |
| Example 7 | 9 | Polyethylene (5 nm) | Nylon 6.6 (20 nm) | 1 | A | A | A | A | A | A | 3 |
| Example 8 | 29 | Polyethylene (2 nm) | Nylon 6.6 (20 nm) | 0 | A | A | A | A | A | A | 0 |

TABLE 1-continued

| | Filtration method | | | Evaluation results | | | | | | | |
|---|---|---|---|---|---|---|---|---|---|---|---|
| | Number of circulations (times) | Materials of first filter (pore diameter) | Materials of second filter (pore diameter) | Number (particles/mL) of particles in liquid | 20 nm Resolution | 18 nm Resolution | 16 nm Resolution | 15 nm Resolution | 14 nm Resolution | 13 nm Resolution | Number (defects) of residual defects |
| Example 9 | 2 | Polyethylene (50 nm) | None | 9 | A | A | A | B | B | C | 48 |
| Example 10 | 4 | Polyethylene (30 nm) | None | 7 | A | A | A | B | B | C | 32 |
| Example 11 | 9 | Polyethylene (10 nm) | None | 6 | A | A | A | A | B | B | 25 |
| Example 12 | 29 | Polyethylene (5 nm) | None | 2 | A | A | A | A | A | A | 10 |
| Example 13 | 2 | Polyethylene (2 nm) | None | 0 | A | A | A | A | A | A | 4 |
| Example 14 | 4 | Polyethylene (10 nm) | Nylon 6.6 (20 nm) | 3 | A | A | A | A | A | A | 9 |
| Example 15 | 9 | Polyethylene (5 nm) | Nylon 6.6 (20 nm) | 1 | A | A | A | A | A | A | 2 |
| Example 16 | 29 | Polyethylene (2 nm) | Nylon 6.6 (20 nm) | 0 | A | A | A | A | A | A | 1 |
| Example 17 | 2 | Polyethylene (50 nm) | None | 9 | A | A | A | A | B | C | 42 |
| Example 18 | 2 | Polyethylene (50 nm) | None | 9 | A | A | A | A | B | B | 39 |
| Example 19 | 2 | Polyethylene (50 nm) | None | 9 | A | A | A | B | B | C | 45 |
| Example 20 | 2 | Polyethylene (50 nm) | None | 9 | A | A | A | A | B | C | 44 |
| Example 21 | 2 | Polyethylene (50 nm) | None | 9 | A | A | A | A | B | B | 42 |
| Example 22 | 2 | Polyethylene (50 nm) | None | 9 | A | A | A | A | A | B | 40 |
| Example 23 | 2 | Polyethylene (50 nm) | None | 9 | A | A | A | A | B | B | 48 |
| Example 24 | 2 | Polyethylene (50 nm) | None | 9 | A | A | A | A | B | B | 45 |
| Example 25 | 2 | Polyethylene (50 nm) | None | 9 | A | A | A | A | A | B | 40 |
| Example 26 | 2 | Polyethylene (2 nm) | None | 1 | A | A | A | A | B | B | 10 |
| Comparative Example 1 | 0 | Polyethylene (50 nm) | None | 50 | A | A | B | C | C | C | 432 |
| Comparative Example 2 | 0 | Nylon 6.6 (40 nm) | None | 100 | A | C | C | C | C | C | 750 |
| Comparative Example 3 | 1 | Nylon 6.6 (40 nm) | None | 55 | A | B | C | C | C | C | 450 |

The actinic ray-sensitive or radiation-sensitive compositions of Examples 1 to 26 were obtained after performing circulation filtration using a filter of a polyethylene-based resin. The number of particles in liquid having particle diameters of 0.15 μm or less included in 1 mL of these actinic ray-sensitive or radiation-sensitive compositions was 10 or less, the resolution was good and there were few residual defects. In Comparative Example 1, filtration was performed using a filter of a polyethylene-based resin, circulation filtration was not performed, and the number of particles in liquid having particle diameters of 0.15 μm or less included in 1 mL of the composition was 50. In addition, in Comparative Example 2, the filter of a polyethylene-based resin was not used, and the number of particles in liquid having particle diameters of 0.15 μm or less included in 1 mL of the composition was 100. In Comparative Examples 1 and 2, the resolution was deteriorated, and there were more residual defects than in Examples.

In Examples 9 to 25 (organic solvent development), the same effects were obtained even with a liquid obtained by mixing two or more of the liquids described in the specification as the developer or the rinsing liquid.

The same effects were obtained even with the addition of at least one selected from the basic compound, the ultraviolet absorber, the surfactant, and the other additives described in the specification to the actinic ray-sensitive or radiation-sensitive compositions used in Examples.

EXPLANATION OF REFERENCES

1: tank
2: pump
3: flow meter
4: container filled with treatment liquid
5, 6, 7: flow paths
8: filling port
100: column with first filter installed
200: column with second filter installed

What is claimed is:
1. An actinic ray-sensitive or radiation-sensitive composition comprising:
a cation including a metal atom; and
a ligand, wherein the number of particles in liquid having particle diameters of 0.15 µm or less included in 1 mL of the actinic ray-sensitive or radiation-sensitive composition is 10 or less.

2. The actinic ray-sensitive or radiation-sensitive composition according to claim 1,
wherein the actinic ray-sensitive or radiation-sensitive composition contains a suboxide cation of a metal atom, a counter anion, a peroxide-based ligand, and water.

3. The actinic ray-sensitive or radiation-sensitive composition according to claim 1,
wherein the actinic ray-sensitive or radiation-sensitive composition contains the cation including a metal atom, an organic ligand, and an organic solvent.

4. The actinic ray-sensitive or radiation-sensitive composition according to claim 1,
wherein the metal atom is at least one selected from hafnium, zirconium, and tin.

5. The actinic ray-sensitive or radiation-sensitive composition according to claim 1,
wherein the metal atom is at least one selected from hafnium and zirconium.

6. The actinic ray-sensitive or radiation-sensitive composition according to claim 1,
wherein the metal atom is tin.

7. A method for purifying an actinic ray-sensitive or radiation-sensitive composition, comprising subjecting a solution of an actinic ray-sensitive or radiation-sensitive composition containing a cation including a metal atom and a ligand to circulation filtration using a filter of a polyethylene-based resin,
wherein the number of particles in liquid having particle diameters of 0.15 µm or less included in 1 mL of the actinic ray-sensitive or radiation-sensitive composition after the circulation filtration is 10 or less.

8. The method for purifying an actinic ray-sensitive or radiation-sensitive composition according to claim 7,
wherein the circulation filtration is performed using a filter of a polyamide-based resin in combination with the filter of a polyethylene-based resin.

9. The method for purifying an actinic ray-sensitive or radiation-sensitive composition according to claim 8,
wherein a pore diameter of the filter of a polyethylene-based resin is 10 nm or less.

10. The method for purifying an actinic ray-sensitive or radiation-sensitive composition according to claim 7,
wherein a pore diameter of the filter of a polyethylene-based resin is 10 nm or less.

11. A pattern forming method comprising the method for purifying an actinic ray-sensitive or radiation-sensitive composition according to claim 7.

12. A method for manufacturing an electronic device, comprising the pattern forming method according to claim 11.

* * * * *